(12) United States Patent
Chann et al.

(10) Patent No.: US 8,531,772 B2
(45) Date of Patent: *Sep. 10, 2013

(54) EXTERNAL-CAVITY ONE-DIMENSIONAL MULTI-WAVELENGTH BEAM COMBINING OF TWO-DIMENSIONAL LASER ELEMENTS

(75) Inventors: Bien Chann, Merrimack, NH (US); Tso Yee Fan, Belmont, MA (US); Antonio Sanchez-Rubio, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 128 days.

This patent is subject to a terminal disclaimer.

(21) Appl. No.: 13/231,407

(22) Filed: Sep. 13, 2011

(65) Prior Publication Data

US 2012/0002272 A1 Jan. 5, 2012

Related U.S. Application Data

(63) Continuation of application No. 12/611,514, filed on Nov. 3, 2009, now Pat. No. 8,049,966.

(60) Provisional application No. 61/111,258, filed on Nov. 4, 2008.

(51) Int. Cl.
*G02B 27/10* (2006.01)
*H01S 3/08* (2006.01)

(52) U.S. Cl.
USPC ............... 359/624; 372/102; 372/98; 372/92

(58) Field of Classification Search
USPC .................. 359/337.21, 341.3, 341.33, 349, 359/624; 372/25, 92, 98, 102
See application file for complete search history.

(56) References Cited

U.S. PATENT DOCUMENTS

| 4,467,468 A | 8/1984 | Miller |
| 4,817,207 A | 3/1989 | Smith et al. |

(Continued)

FOREIGN PATENT DOCUMENTS

| EP | 0938197 A2 | 8/1999 |
| JP | 2007165624 A | 6/2007 |

(Continued)

OTHER PUBLICATIONS

Augst, Steven J. et al., "Beam Combining of Ytterbium Fiber Amplifiers (Invited)," Journal of Optical Social America B., vol. 24, No. 8, Aug. 2007.

(Continued)

*Primary Examiner* — David N Spector
(74) *Attorney, Agent, or Firm* — Lando & Anastasi, LLP

(57) ABSTRACT

An external-cavity one-dimensional multi-wavelength beam combiner that performs wavelength beam combining along a stacking dimension of a laser stack formed of a plurality of laser arrays, each laser array configured to generate optical radiation having a unique wavelength, and each of the plurality of laser arrays including one or more laser emitters arranged along an array dimension of the laser stack. The multi-wavelength beam combiner includes an optical imaging element configured to image each of the laser emitters along a slow axis of the laser emitters, an optical focusing element arranged to intercept the optical radiation from each of the plurality of laser arrays and combine the optical radiation along a stacking dimension of the laser stack to form a multi-wavelength optical beam, and a diffraction element positioned at a region of overlap of the optical radiation to receive and transmit the multi-wavelength optical beam.

26 Claims, 34 Drawing Sheets

(56) References Cited

U.S. PATENT DOCUMENTS

| | | |
|---|---|---|
| 4,961,195 A | 10/1990 | Skupsky et al. |
| 5,005,166 A | 4/1991 | Suzuki et al. |
| 5,010,543 A | 4/1991 | Hill |
| 5,076,672 A | 12/1991 | Tsuda et al. |
| 5,319,484 A | 6/1994 | Jacob et al. |
| 5,325,222 A | 6/1994 | Jacob et al. |
| 5,329,396 A | 7/1994 | Fishman et al. |
| 5,404,240 A | 4/1995 | Nishio et al. |
| 5,589,967 A | 12/1996 | Auffret |
| 5,631,758 A | 5/1997 | Knox et al. |
| 5,694,408 A | 12/1997 | Bott et al. |
| 5,861,965 A | 1/1999 | Koren et al. |
| 5,892,607 A | 4/1999 | Atlas |
| 6,061,369 A | 5/2000 | Conradi |
| 6,100,831 A | 8/2000 | Frankel |
| 6,167,075 A | 12/2000 | Craig et al. |
| 6,192,062 B1 | 2/2001 | Sanchez-Rubio et al. |
| 6,212,310 B1 | 4/2001 | Waarts et al. |
| 6,252,693 B1 | 6/2001 | Blauvelt |
| 6,275,632 B1 | 8/2001 | Waarts et al. |
| 6,307,668 B1 | 10/2001 | Bastien et al. |
| 6,327,068 B1 | 12/2001 | Silberberg et al. |
| 6,327,292 B1 | 12/2001 | Sanchez-Rubio et al. |
| 6,330,388 B1 | 12/2001 | Bendett et al. |
| 6,356,576 B1 | 3/2002 | Smith |
| 6,381,048 B1 | 4/2002 | Chraplyvy et al. |
| 6,400,871 B1 | 6/2002 | Minden |
| 6,434,175 B1 | 8/2002 | Zah |
| 6,570,704 B2 | 5/2003 | Palese |
| RE38,289 E | 10/2003 | Bergano |
| 6,678,294 B1 | 1/2004 | Komine et al. |
| 6,763,054 B2 | 7/2004 | Whitley |
| 6,775,478 B2 | 8/2004 | Suzuki et al. |
| 7,020,168 B2 | 3/2006 | Bernasconi et al. |
| 7,110,168 B2 | 9/2006 | Lee et al. |
| 7,199,924 B1 | 4/2007 | Brown et al. |
| 7,239,777 B1 | 7/2007 | Christensen et al. |
| 7,271,949 B2 | 9/2007 | Kim et al. |
| 7,272,319 B1 | 9/2007 | Piccirilli et al. |
| 7,298,771 B2 | 11/2007 | Volodin et al. |
| 7,339,727 B1 | 3/2008 | Rothenberg et al. |
| 7,340,172 B2 | 3/2008 | Giles et al. |
| 7,346,085 B1 | 3/2008 | Rothenberg et al. |
| 7,376,349 B2 | 5/2008 | Ionov et al. |
| 7,436,588 B2 | 10/2008 | Rothenberg et al. |
| 7,440,174 B2 | 10/2008 | Rice et al. |
| 7,468,832 B2 | 12/2008 | Rothenberg et al. |
| 7,574,139 B2 | 8/2009 | Fu et al. |
| 7,620,324 B2 | 11/2009 | Minato et al. |
| 7,653,096 B2 | 1/2010 | Kawai |
| 7,702,240 B2 | 4/2010 | Minato |
| 7,764,720 B1 | 7/2010 | Bronder et al. |
| 7,953,129 B2 | 5/2011 | Kawai |
| 8,023,538 B2 | 9/2011 | Marcinkevicius et al. |
| 8,049,966 B2 * | 11/2011 | Chann et al. ............ 359/624 |
| 8,125,704 B2 | 2/2012 | Mielke et al. |
| 8,179,594 B1 | 5/2012 | Tidwell et al. |
| 8,184,361 B2 | 5/2012 | Rothenberg et al. |
| 8,184,363 B2 | 5/2012 | Rothenberg |
| 2001/0017720 A1 | 8/2001 | Hait |
| 2001/0017721 A1 | 8/2001 | Hait |
| 2002/0126346 A1 | 9/2002 | Suzuki et al. |
| 2003/0095737 A1 | 5/2003 | Welch et al. |
| 2003/0219205 A1 | 11/2003 | Volodin et al. |
| 2004/0052278 A1 | 3/2004 | Kane et al. |
| 2004/0057475 A1 | 3/2004 | Frankel et al. |
| 2004/0095983 A1 | 5/2004 | Whitley |
| 2005/0002424 A1 | 1/2005 | Bernasconi et al. |
| 2006/0120418 A1 | 6/2006 | Harter et al. |
| 2006/0171428 A1 | 8/2006 | Volodin |
| 2006/0257150 A1 | 11/2006 | Tsuchiya et al. |
| 2006/0291862 A1 | 12/2006 | Kawai |
| 2007/0047608 A1 | 3/2007 | Volodin et al. |
| 2007/0078449 A1 | 4/2007 | Hayashi et al. |
| 2007/0086010 A1 | 4/2007 | Rothenberg |
| 2007/0201795 A1 | 8/2007 | Rice et al. |
| 2007/0280325 A1 | 12/2007 | Wang |
| 2008/0084598 A1 | 4/2008 | Rothenberg et al. |
| 2008/0084605 A1 | 4/2008 | Rothenberg et al. |
| 2008/0085128 A1 | 4/2008 | Rothenberg et al. |
| 2008/0089698 A1 | 4/2008 | Jiang et al. |
| 2009/0201575 A1 | 8/2009 | Fermann et al. |
| 2010/0073658 A1 | 3/2010 | Kawai |
| 2010/0110556 A1 | 5/2010 | Chann et al. |
| 2011/0032602 A1 | 2/2011 | Rothenberg |
| 2011/0032603 A1 | 2/2011 | Rothenberg |
| 2011/0032604 A1 | 2/2011 | Rothenberg et al. |
| 2011/0147566 A1 | 6/2011 | Furuya et al. |
| 2011/0222574 A1 | 9/2011 | Chann et al. |
| 2011/0280581 A1 | 11/2011 | Chann et al. |
| 2011/0292498 A1 | 12/2011 | Chann et al. |
| 2012/0014397 A1 | 1/2012 | Chann et al. |
| 2012/0188626 A1 | 7/2012 | Rothenberg et al. |
| 2012/0200439 A1 | 8/2012 | Hartl et al. |
| 2012/0212801 A1 | 8/2012 | Rothenberg |
| 2012/0212802 A1 | 8/2012 | Rothenberg et al. |
| 2012/0219021 A1 | 8/2012 | Lippey et al. |
| 2013/0063808 A1 | 3/2013 | Rothenberg |

FOREIGN PATENT DOCUMENTS

| | | |
|---|---|---|
| WO | 2002071119 A1 | 9/2002 |
| WO | 2006097531 A1 | 9/2006 |
| WO | 2006012463 A3 | 11/2007 |
| WO | 2008127451 A2 | 10/2008 |
| WO | 2011109753 A1 | 9/2011 |

OTHER PUBLICATIONS

Bates, Harry et al., "Picosecond Pulse Stacking in Calcite," Applied Optics vol. 18, No. 7, Apr. 1, 1979.

Chann, B et al. "Frequency Narrowed External Cavity Diode Laser Array Bar" Optics Letters, vol. 25. No. 18 Sep. 15, 2000.

Clarkson, W.A. et al., "Two-Mirror Beam-Shaping Technique for High-Power Diode Bars," Optics Letters, vol. 21, No. 6, Mar. 15, 1996.

Dawson, Jay W. et al., "Analysis of the Scalability of Diffraction-Limited Fiber Lasers and Amplifiers to High Average Power," Optics Express, vol. 16, No. 17, Aug. 18, 2008.

Fan, T.Y., "Laser Beam Combining for High-Power, High-Radiance Sources," IEEE Journal of Selected Topics in Quantum Electronics, vol. 11, No. 3, May/Jun. 2005.

Gopinath, J. T. et al., "1450nm High Brightness Wavelength Beam Combined Diode Laser Array" Optics Express, vol. 16, No. 13, Jun. 23, 2008.

Loftus, Thomas H. et al., "Spectrally Beam-Combined Fiber Lasers for High-Average-Power Applications," IEEE Journal of Selected Topics in Quantum Electronics, vol. 13, No. 3, May/Jun. 2007.

Zhou, Shian et al., "Divided-Pulse Amplification of Ultrashort Pulses," Optics Letters, vol. 32, No. 7, Apr. 1, 2007.

Zhu, H. et al., "Spectrally Narrowed External-Cavity High-Power Stack of Laser Diode Arrays", Optics Letters, vol. 30, No. 11, Jun. 1, 2005.

* cited by examiner

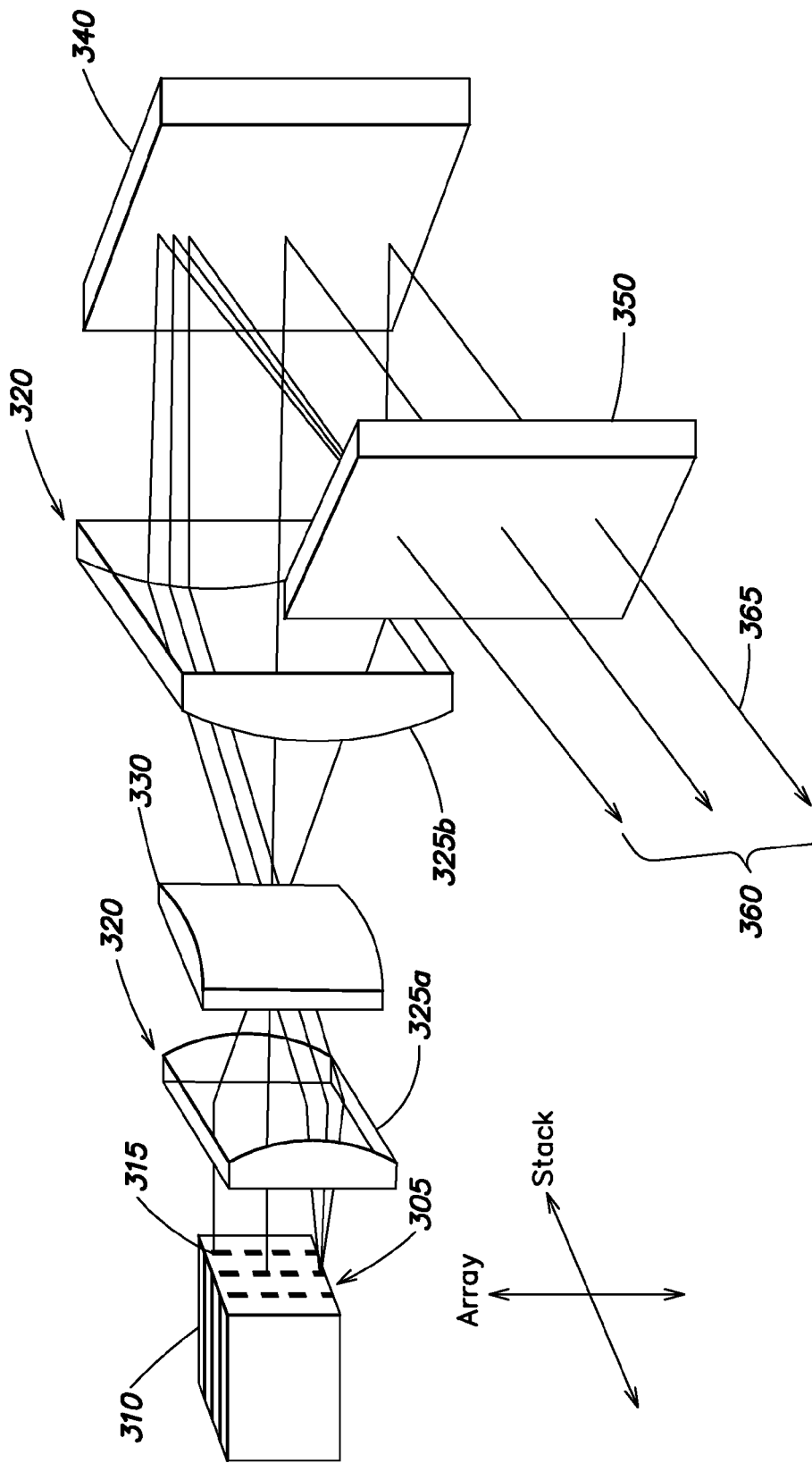

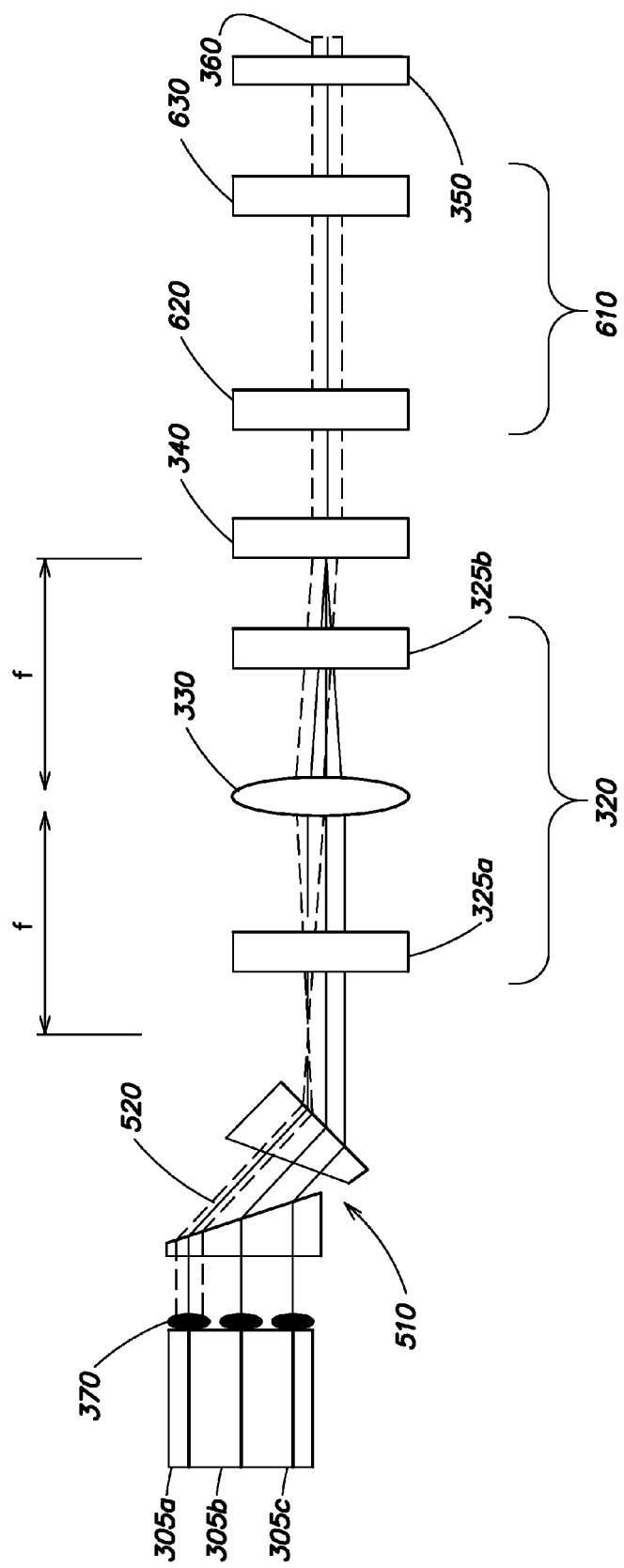

EXTERNAL-CAVITY ONE-DIMENSIONAL MULTI-WAVELENGTH BEAM COMBINING OF TWO-DIMENSIONAL LASER ELEMENTS

CROSS REFERENCE TO RELATED APPLICATIONS

This application is a continuation of and claims priority under 35 U.S.C. §120 to U.S. application Ser. No. 12/611,514 filed on Nov. 3, 2009 and titled "EXTERNAL-CAVITY ONE-DIMENSIONAL MULTI-WAVELENGTH BEAM COMBINING OF TWO-DIMENSIONAL LASER ELEMENTS," which claims priority under 35 U.S.C. §119(e) to U.S. Provisional Application No. 61/111,258 filed Nov. 4, 2008 and entitled "EXTERNAL-CAVITY ONE DIMENSIONAL (1-D) WAVELENGTH-BEAM-COMBINING (WBC) OF 2-D DIODE LASER ELEMENTS," which are incorporated herein by reference in their entireties.

FEDERALLY SPONSORED RESEARCH

This invention was made with government support under Grant No FA8721-05-C-0002 awarded by the United States Air Force. The government has certain rights in this invention.

BACKGROUND

1. Field of Invention

The present invention relates generally to the field of laser sources using an external cavity and, more particularly, to methods and apparatus for external-cavity one-dimensional wavelength beam combining using two-dimensional laser sources.

2. Discussion of Related Art

High-efficiency multi-wavelength laser sources that use laser arrays are utilized for a variety of applications including materials processing, laser pumping and numerous medical procedures. External-cavity one-dimensional wavelength beam combining of diode laser arrays and two-dimensional diode stacks has been described in U.S. Pat. No. 6,327,292 as a technique to enhance the power and brightness of laser arrays and stacks.

Referring to FIG. 1A, there is illustrated an example of a wavelength beam combiner base-line architecture for external-cavity one-dimensional wavelength beam combining of two-dimensional laser stacks. FIG. 1A illustrates a closed-loop wavelength beam combining cavity. The cavity comprises a laser stack 110 which, in the illustrated example, includes a vertical stack of three laser diode bars, each bar comprising a plurality of laser diode elements, also referred to as emitters, to be combined. The cavity also comprises a cylindrical lens 120, diffraction grating 130, and a partially reflecting output coupler 140. The cylindrical lens 120 is placed at a distance equal to one focal length between the laser stack 110 and the diffraction grating 130. The cylindrical lens 120 converges the optical beams from the laser diode elements of each diode bar in the stack such that the beams are spatially overlapped, forming a region of overlap at the surface of the diffraction grating 130. The partially reflecting output coupler 140 is placed on the path of the first-order diffracted beams from the diffraction grating 130 and reflects a portion of each beam back toward the region of overlap, and the diffraction grating 130 then reflects light back to the laser stack 110. A resonant cavity is thereby formed between partially reflecting output coupler 140 and the laser diode elements of the laser stack 110. The partially reflecting output coupler 140 and the diffraction grating 130 thus provide feedback that forces each laser diode element in each respective diode bar to lase at a unique, but controlled, wavelength, and overlap the optical beams in the near field (at the output coupler 140) and far field. Thus, as shown in FIG. 1A, by properly arranging the cylindrical lens 120, diffraction grating 130, and output coupler 140, a single beam for each diode bar in the laser stack 110 can be produced.

In the example illustrated in FIG. 1A, the output beams 150 include three beams, one from each of the three diode bars in the laser stack 110, and each of the three output beams comprises the spatially overlapped optical beams from the laser diode elements making up the respective diode bar. Thus, wavelength beam combining is performed along the horizontal dimension of the laser stack 110. Stacking of multiple diode bars in the vertical dimension is for power scaling.

FIG. 1B illustrates an open-loop wavelength beam combining cavity. In the open-loop cavity, the laser elements are wavelength stabilized to a unique wavelength using a wavelength-chirped volume Bragg grating (VBG) 160. The volume Bragg grating 160 is placed as close as possible (e.g., about 1 mm) to the laser stack 110. The cylindrical lens 120 and the diffraction grating 130 match the wavelength spread of the volume Bragg grating 160. Again, wavelength beam combining of the laser elements is performed in the horizontal dimension, and vertical stacking of multiple diode bars in the vertical dimension is done for power scaling.

SUMMARY OF THE INVENTION

Aspects and embodiments are directed to a method and apparatus for one-dimensional wavelength beam combining of two-dimensional laser sources (for example laser arrays and stacks for diode lasers) to enhance the power and brightness of these laser sources. Important properties of a wavelength beam combining system include output spectrum, output beam quality, size and efficiency. As discussed above, in conventional one-dimensional wavelength beam combiners for diode laser arrays, wavelength beam combining is performed along the "array" or row dimension, that is, the optical beams from the plurality of laser diode elements making up a single diode bar are combined. By contrast, according to aspects and embodiments, wavelength beam combining is performed along the orthogonal dimension, and for diode laser sources this is along the "stacking" dimension of the array, that is, the optical beams from each of a plurality of diode bars are combined, which relaxes the tolerances required and allows low-cost, off-the-shelf diode bars to be used. In particular, at least some embodiments are directed to a wavelength beam combining implementation in which, when applied to diode laser sources, robustness and efficiency are substantially independent of "smile" and pointing errors, as discussed further below. Wavelength beam combining along the stacking dimension allows a higher-power laser to be constructed at much lower cost than is the case with conventional wavelength beam combining, and has utility in a wide variety of applications.

According to one embodiment, a multi-wavelength beam combiner comprises a laser stack comprising a plurality of laser arrays arranged along a stacking dimension of the laser stack, each laser array configured to generate optical radiation having a unique wavelength, and each of the plurality of laser arrays comprising a plurality of optical gain elements arranged along an array dimension of the laser stack. The multi-wavelength beam combiner further comprises a cylindrical telescope configured to image each of the plurality of optical gain elements along a slow axis of the optical gain elements, and a transform lens arranged to intercept the optical radiation from each of the plurality of laser arrays and combine the optical radiation along a stacking dimension of the laser stack to form a multi-wavelength optical beam, and a diffraction element positioned at a region of overlap of the optical radiation to receive and transmit the multi-wavelength optical beam. The cylindrical telescope is configured to image each of the plurality of optical gain elements onto the diffraction element. The stacking dimension may be substantially perpendicular to the array dimension.

In one example, the plurality of laser arrays comprises a plurality of laser diode bars, and the plurality of optical gain elements comprises a plurality of laser diode emitters. In another example, the plurality of laser arrays comprises a plurality of fiber laser arrays, and the plurality of optical gain elements comprises a plurality of fiber laser emitters. In another example, the laser stack comprises a stack of discrete semiconductor laser emitters, which may be semiconductor dies or semiconductor packaged dies, arranged in rows along the array dimension, and the each laser array of the plurality of laser arrays comprises a row of the discrete semiconductor laser emitters.

According to another example, the multi-wavelength beam combiner further comprises a volume Bragg grating positioned between the laser stack and the cylindrical telescope and configured to form a free-space cavity with the laser stack to generate the plurality of unique wavelengths. The volume Bragg grating may be a wavelength-chirped volume Bragg grating, wherein the wavelength is chirped along the stacking dimension. In one example, the transform lens is positioned a focal length away from the laser stack. In another example, the diffraction element is a diffraction grating. In another example, the transform lens is a cylindrical transform lens. The cylindrical telescope may comprise a first lens element and a second lens element, and the transform lens may be positioned between the first and second lens elements. The external-cavity multi-wavelength beam combiner may further comprise a partially reflecting output coupler arranged to receive the multi-wavelength optical beam from the diffraction element, to reflect a portion of the multi-wavelength optical beam back to the region of overlap, and to transmit the multi-wavelength optical beam comprising optical radiation having the plurality of unique wavelengths, wherein the diffraction element, the partially reflecting output coupler and the laser stack together form a free space cavity that produces the plurality of unique wavelengths. The partially reflecting output coupler may be a passive fiber output coupler. The external-cavity multi-wavelength beam combiner may further comprise an anamorphic beam expander positioned between the laser stack and the cylindrical telescope. The external-cavity multi-wavelength beam combiner may also comprise an additional cylindrical telescope positioned between the diffraction element and the partially reflecting output coupler, wherein the additional cylindrical telescope is configured to image the plurality of laser diode emitters along the array dimension onto the partially reflecting output coupler. The multi-wavelength beam combiner may further comprise a plurality of collimating micro-lenses coupled to the laser stack.

According to another embodiment, an external-cavity multi-wavelength beam combiner comprises a laser stack including a first laser array configured to generate a first optical beam having a first wavelength, and a second laser array configured to generate a second optical beam having a second wavelength, each of the first and second laser arrays comprising a plurality of optical gain elements arranged along an array dimension of the laser stack and configured to produce optical radiation to generate the first and second optical beams. The external-cavity multi-wavelength beam combiner further comprises a cylindrical telescope arranged to intercept the optical radiation and to image each of the plurality optical gain elements along the array dimension, and a transform lens arranged to intercept the first and second optical beams and to spatially overlap in a stacking dimension of the laser stack the first and second optical beams to form a multi-wavelength optical beam. In addition, the external-cavity multi-wavelength beam combiner includes a diffraction element positioned at a region of overlap of the first and second optical beams, and a partially reflecting output coupler arranged to receive the multi-wavelength optical beam from the diffraction element, to reflect a portion of the multi-wavelength optical beam back to the region of overlap, and to transmit the multi-wavelength optical beam comprising optical radiation having the first and second wavelengths. The diffraction element, the partially reflecting output coupler and the laser stack together form a free space cavity that produces the first and second wavelengths, wherein the stacking dimension is substantially perpendicular to the array dimension.

In one example, the first and second laser arrays are laser diode bars, each laser diode bar comprising a plurality of laser diode emitters. In another example, the laser stack comprises a stack of semiconductor laser emitters arranged in rows along the array dimension, wherein the first and second laser arrays each comprises a row of the semiconductor laser emitters. In another example, the plurality of first and second laser arrays are fiber laser arrays, and the plurality of optical gain elements comprises a plurality of fiber laser emitters.

In one example of the external-cavity multi-wavelength beam combiner, the transform lens is configured to form the multi-wavelength optical beam by combining along the stacking dimension the first and second optical beams. In another example, the cylindrical telescope is configured to image each of the plurality of optical gain elements along a slow axis of the optical gain elements onto the diffraction element. The external-cavity multi-wavelength beam combiner may further comprise an anamorphic beam expander positioned between the laser stack and the cylindrical telescope. The external-cavity multi-wavelength beam combiner may also comprise an additional cylindrical telescope positioned between the diffraction element and the partially reflecting output coupled and configured to image in the array dimension an image on the diffraction element onto the partially reflecting output coupler. In one example, an imaging telescope is positioned between the laser stack and the cylindrical telescope and configured to reduce a beam size of the first and second optical beams in the stacking dimension. The imaging telescope may comprise a first lens and a second lens, wherein at least one of the first and second lenses is a spherical lens.

According to another embodiment, a multi-wavelength beam combiner comprises a stacked array of a plurality of laser diode bars, each laser diode bar comprising one or more laser diode elements arranged along an array dimension of the stacked array and configured to produce light, a cylindrical telescope arranged to receive the light produced by the one or more laser diode elements and configured to image the light along the array dimension, and a cylindrical transform lens arranged to receive the light and configured to form a multi-wavelength beam of light comprising overlapping beams of the light produced by each of the plurality of laser diode bars.

Another embodiment is directed to a method of wavelength beam combining. The method comprises acts of generating with a plurality of laser arrays a plurality of optical beams each having a unique wavelength, imaging the plurality of optical beams along a first dimension, and spatially overlapping the plurality of optical beams in a second dimension at a region of overlap to produce a multi-wavelength optical beam comprising the plurality of unique wavelengths. In one example, spatial overlapping the plurality of optical beams includes propagating the plurality of optical beams to a diffractive element positioned at the region of overlap. The method may further comprise acts of propagating the multi-wavelength optical beam to a partially reflecting element positioned to receive radiation from the diffractive element, the partially reflecting element and the plurality of laser arrays together forming a free space laser cavity that produces the plurality of unique wavelengths, and transmitting the multi-wavelength beam comprising radiation having the plurality of unique wavelengths through the partially reflecting element. In another example, the method further comprises stabilizing the plurality of unique wavelengths with a wavelength-chirped volume Bragg grating.

Still other aspects, embodiments, and advantages of these exemplary aspects and embodiments, are discussed in detail below. Any embodiment disclosed herein may be combined with any other embodiment in any manner consistent with the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

FIG. 3 is a diagram of one example of a closed loop one-dimensional wavelength beam combining cavity according to aspects of the invention;

FIG. 6A is an optically equivalent diagram in the wavelength beam combining or stacking dimension of another example of a closed-loop one-dimensional wavelength beam combining cavity according to aspects of the invention;

DETAILED DESCRIPTION

Aspects and embodiments relate generally to the field of scaling laser sources to high-power and high-brightness using an external cavity and, more particularly, to methods and apparatus for external-cavity one-dimensional wavelength beam combining using two-dimensional laser sources. Aspects and embodiments further relate to high-power and/or high-brightness multi-wavelength external-cavity lasers that generate an overlapping or coaxial beam.

In particular, aspects and embodiments are directed to a method and apparatus for one-dimensional wavelength beam combining of two-dimensional laser sources that can be mechanically or optically arranged in rows or arrays and in columns or stacks to enhance the power and brightness. For example, laser sources based on common "off-the-shelf" high power laser diode arrays and stacks are based on broad-area diode laser elements. Typically, the beam quality of these elements is diffraction-limited along the fast axis and many times diffraction-limited along the slow axis of the laser elements. It is to be appreciated that although the following discussion may refer primarily to laser diodes, diode bars and diode stacks, embodiments of the invention are not limited to laser diodes and may be used with many different types of laser emitters, including fiber lasers, individually packaged diode lasers, semiconductor lasers and other types of lasers. Furthermore, as used herein, the term "array" refers to one or more laser elements placed side by side. The array dimension is along the slow axis. As used herein, the term "stack" refers to two or more arrays stacked together. A stack can be arranged mechanically or optically. In one example, a mechanically arranged stack includes two or more arrays which are physically stacked on top of another to produce output beams which are stacked on top of one another. An optically arranged stack can be achieved by using optics to arrange the output beams from two or more arrays, each beam from a corresponding array, such that the output beams are stacked on top of one another. The stacking dimension is along the fast axis of the laser elements.

Figure 18A:
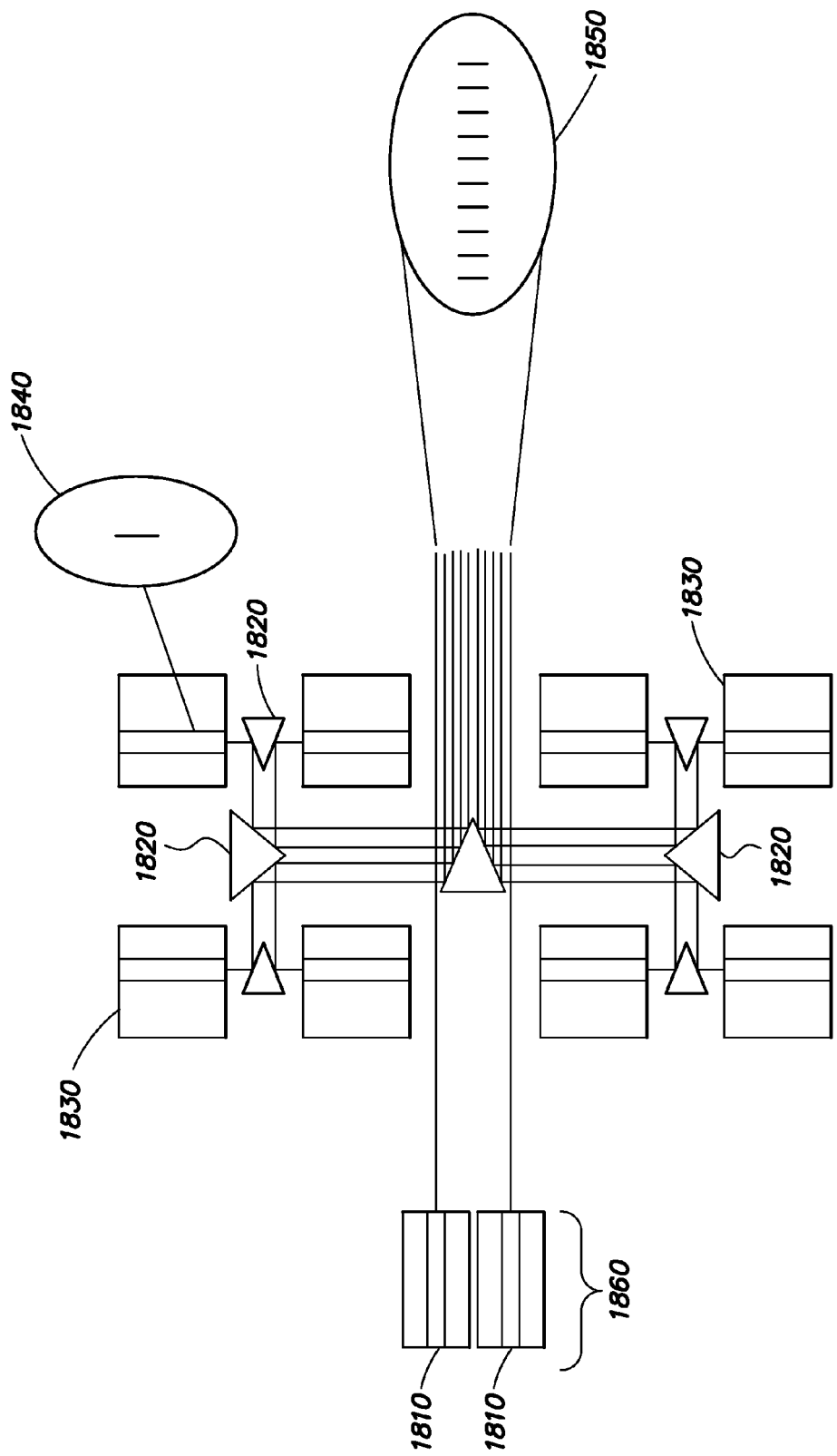
FIG. 18A is a top view of one example of an optically arranged stack of individual optical elements according to aspects of the invention.
Figure 18B:
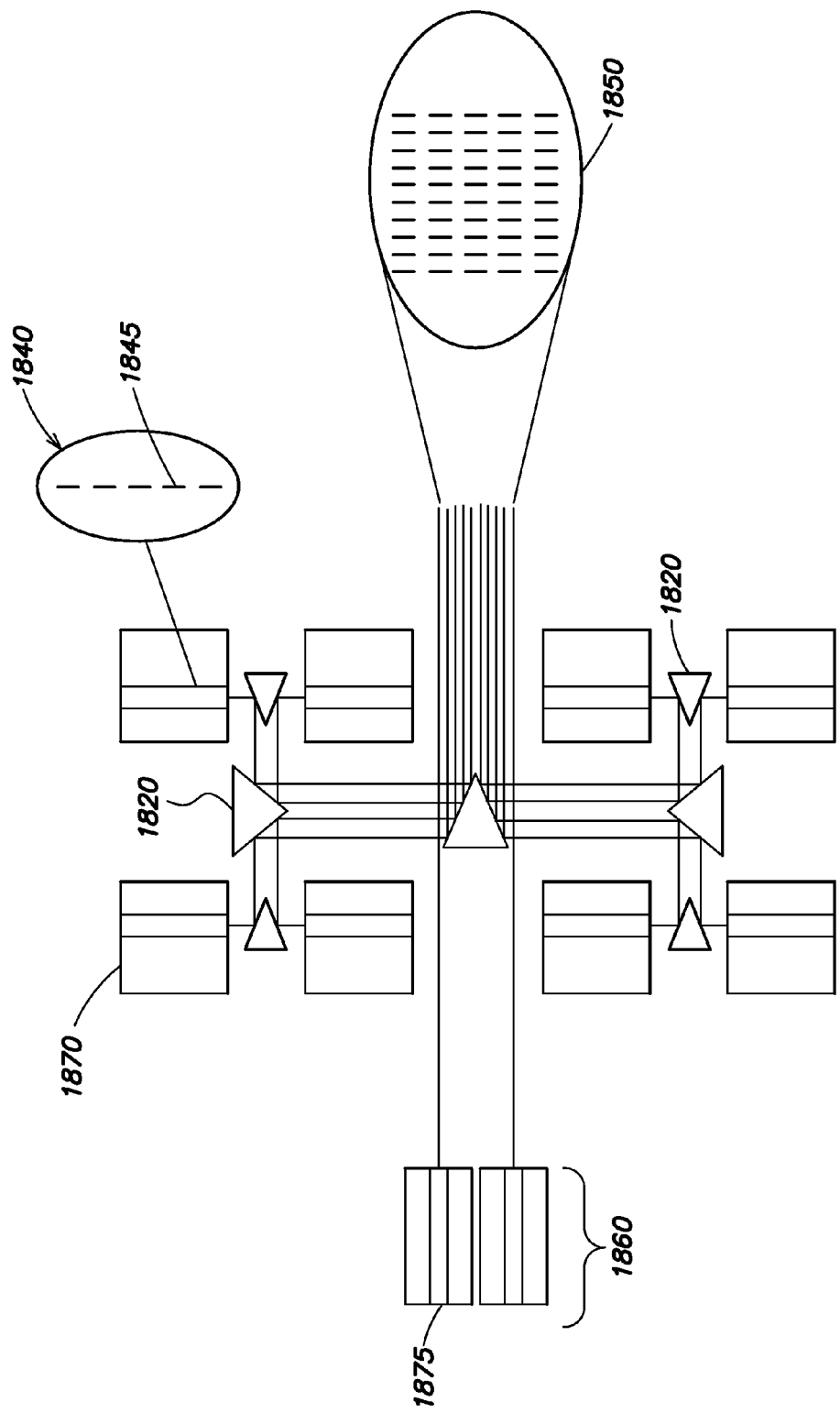
FIG. 18B is a top view of one example of an optically arranged stack of diode arrays or bars, according to aspects of the invention.
Figure 18C:
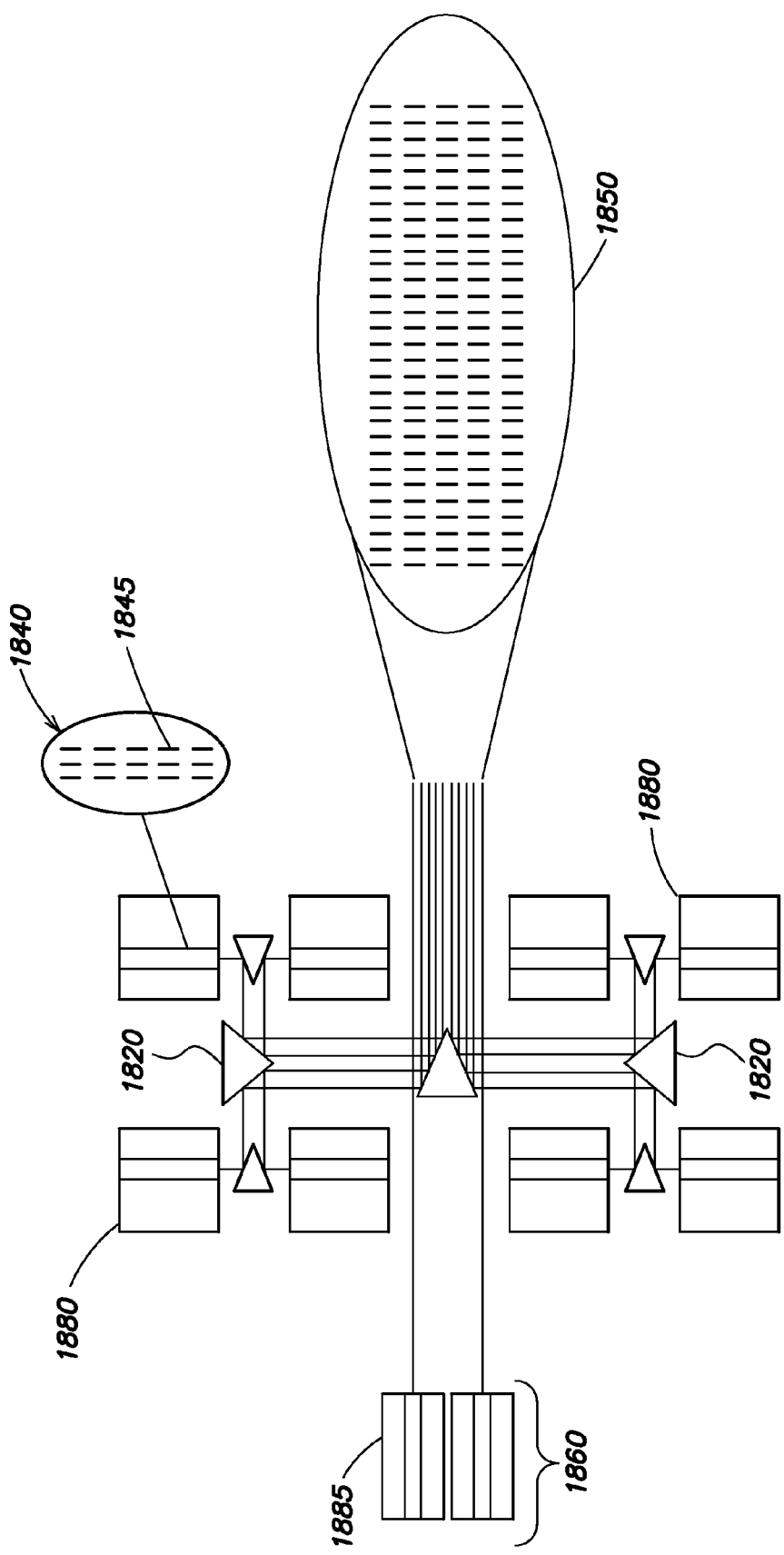
FIG. 18C is a top view of one example of an optically arranged stack of laser stacks, according to aspects of the invention.
Figure 18D:
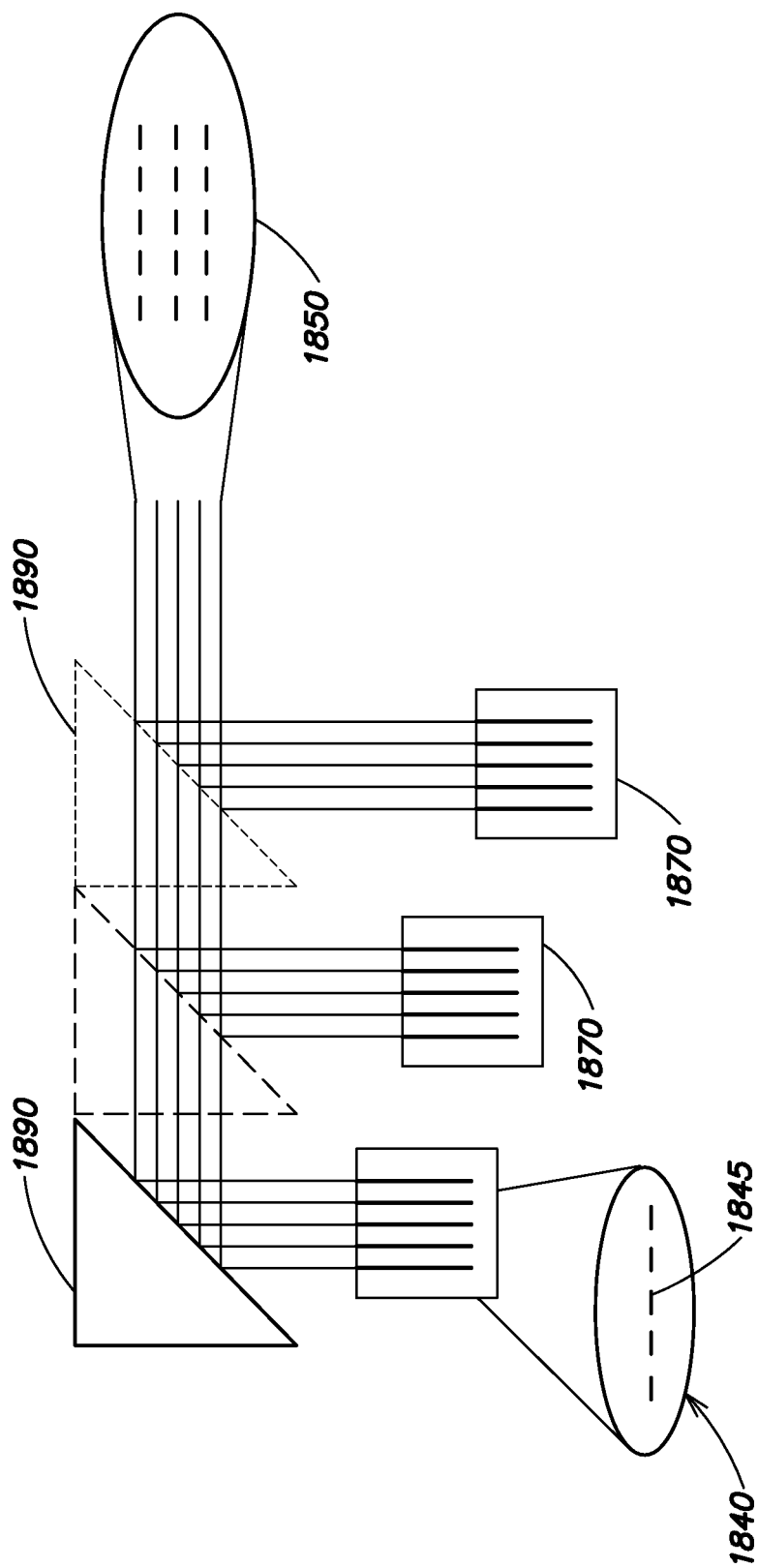
FIG. 18D is a top view of another example of an optically arranged stack of diode arrays or bars, according to aspects of the invention.

Referring to FIGS. 18A-18D, there are illustrated examples of optically arranged stacks. FIG. 18A illustrates an optically arranged stack of individual optical elements 1810. Mirrors 1820 are used to arrange the optical beams from optical elements 1830, each optical element 1830 having a near field image 1840, to produce an image 1850 (which includes optical beams from each optical element 1830) corresponding to a stack 1860 (in the horizontal dimension) of the individual optical elements 1810. Although the optical elements 1830 may not be arranged in a stack, the mirrors 1820 arrange the optical beams such that the image 1850 appears to correspond to the stack 1860 of optical elements 1810. Similarly, in FIG. 18B, the mirrors 1820 can be used to arrange optical beams from diode bars or arrays 1870 to create an image 1850 corresponding to a stack 1860 of diode bars or arrays 1875. In this example, each diode bar or array 1870 has a near field image 1840 that includes optical beams 1845 from each individual element in the bar or array. Similarly, the minors 1820 may also be used to optically arrange laser stacks 1880 into an apparent larger overall stack 1860 of individual stacks 1885 corresponding to image 1850, as shown in FIG. 18C. Another example of an optically arranged stack is illustrated in FIG. 18D. In this example, folding minors 1890, arranged at different heights, are used to arrange the optical beams diode arrays or bars 1870 to produce an image 1850 corresponding to an apparent physical stack of the diode arrays or bars 1870. As discussed above, each diode array or bar 1870 has an image 1840 corresponding to an array of beams 1845 from the individual elements in the array or bar. The arrangement illustrated in FIG. 18D may similarly be applied to individual optical elements 1830 and/or stacks 1880. Thus, it is to be appreciated that any of the laser stacks discussed herein may be mechanically or physically arranged stacks or may be optically arranged stacks according to one of the examples discussed above or other optical stacking arrangements as would be apparent to those skilled in the art, given the benefit of this disclosure.

As discussed above, conventional wavelength beam combiners combine the light from individual laser elements of a single diode bar to create a single beam for each diode bar. Thus, wavelength beam combining is traditionally done along the array dimension or slow axis of the laser stack. This type of beam combining imposes tight tolerances on the diode arrays and requires both very well-manufactured bars and accurate stacking of the bars, resulting in added cost. By contrast, according to one embodiment, wavelength beam combining is performed along the stacking dimension or fast axis of the laser stack. This allows construction of a lower cost, robust cavity that may provide significant benefits over conventional wavelength beam combining cavities, as discussed further below.

Important properties for wavelength beam combining systems include output spectrum, output beam quality, size and efficiency. If the laser element(s) in a stack have diffraction-limited beam quality along both axes (i.e., the fast axis and the slow axis), then the output spectrum, output beam quality and size may be substantially similar for conventional architectures that perform wavelength beam combining along the array dimension and architectures according to embodiments of the invention that perform wavelength beam combing along the stacking dimension. However, embodiments performing wavelength beam combining along the stacking dimension may have improved efficiency and manufacturability, as discussed further below. In addition, if the laser element is not diffraction-limited along the slow axis, the output characteristics in the two dimensions may be vastly different, and wavelength beam combining along the stacking dimension may provide significant advantages, including superior performance and lower cost than conventional architectures that perform the wavelength beam combining along the array dimension. Thus, as discussed further below, at least some aspects and embodiments may achieve a significantly higher power laser source, and at significantly lower cost, than is achievable using conventional wavelength beam combining techniques.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation.

Figure 1A:
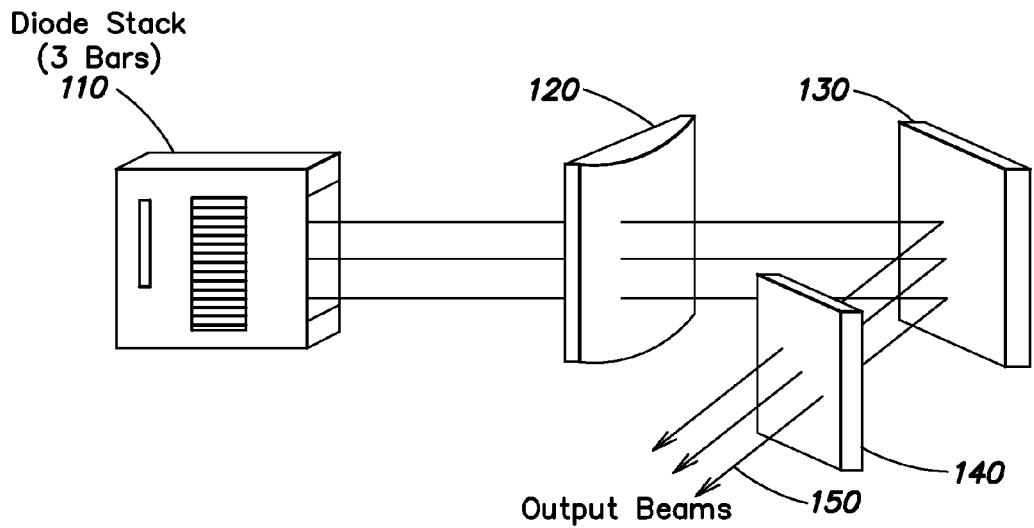
FIG. 1A is an example of a conventional closed-loop baseline architecture for one-dimensional wavelength beam combining along the array dimension of a laser diode stack.
Figure 1B:
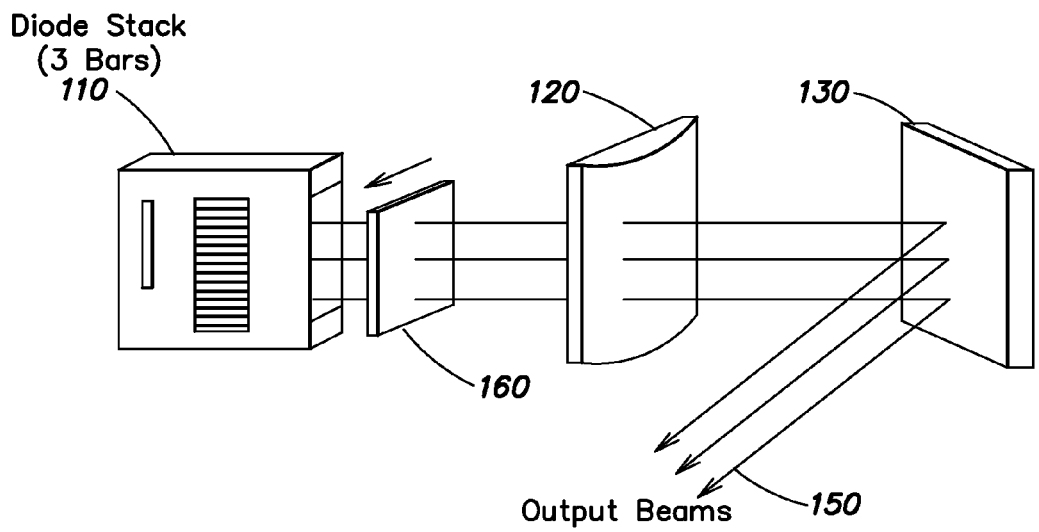
FIG. 1B is an example of a conventional open-loop baseline architecture for one-dimensional wavelength beam combining along the array dimension of a laser diode stack.

Two key characteristics that are highly desired for robust and efficient conventional wavelength beam combining in diode arrays and stacks are low packaging error, referred to herein as "smile," and low pointing errors (also referred to as collimation error). Smile, or bending of the array during packaging, and pointing error caused by misalignment of the collimating micro-lenses on the array degrade the output beam quality and reduce the beam combining efficiency. Conventional wavelength beam combining cavities, such as those illustrated in FIGS. 1A and 1B, do not compensate for smile and pointing error, and thus diode arrays and stacks with very low smile and pointing error are needed for robust and efficient wavelength beam combining. Accordingly, conventional architectures impose tight tolerances on the components and arrangement of components in order to meet desired power and/or brightness goals. By contrast, aspects and embodiments are directed to methods and architectures in which the robustness and efficiency of the wavelength beam combining cavity are independent of smile and pointing errors, thus relaxing the tolerances allowing low-cost "off-the-shelf" components to be used.

Figure 2:
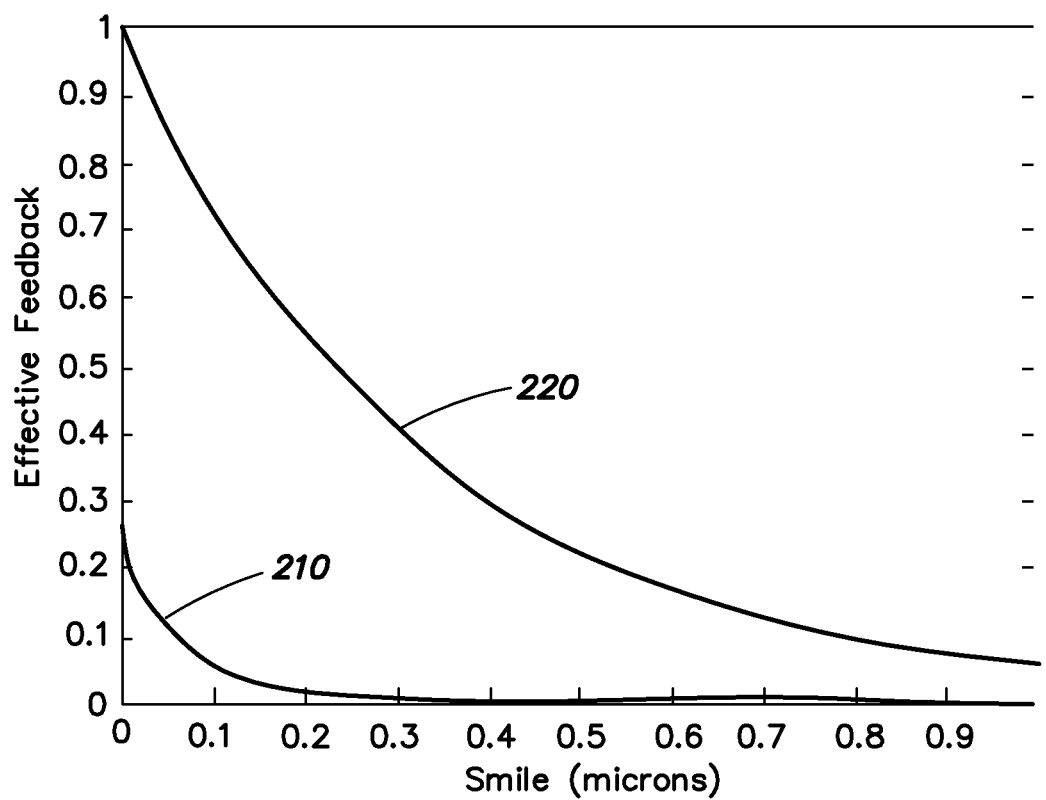
FIG. 2 is a graph illustrating effective self-feedback due to smile for examples of open-loop and closed-loop conventional wavelength beam combiner architectures.

Referring to FIG. 2, there are illustrated a plots the effective self-feedback of a closed-loop cavity (curve 210) and an open-loop cavity (curve 220) as a function of the amount of smile in a diode bar. As used herein, the term "self-feedback" refers to the amount of light from an individual laser element that is reflected off the output coupler 140 and back onto the laser element. Curve 210 corresponds to a closed-loop wavelength beam combiner (such as that shown in FIG. 1A) in which the output coupler 140 is placed at 1000 millimeters (mm) from the front facet of the laser stack 110. 1000 mm is a typical placement of the output coupler in the closed-loop wavelength beam combining cavity. Curve 220 corresponds to an open-loop wavelength beam combiner (such as that shown in FIG. 1B), in which the volume Bragg grating 160 is placed at 1 mm from front facet of the laser stack 110. In both cases, it is assumed that each diode bar in the laser stack is collimated by a cylindrical lens 120 with focal length of 910 microns. This is a typical focal length used for commercial diode arrays and stacks.

As can be seen with reference to FIG. 2, for the closed-loop example (curve 210) even when the smile is zero, the amount of self-feedback is only about 22%. This is due to the natural divergence of the Gaussian beam. At about 0.3 microns of smile, the self-feedback is essentially zero and the cavity will therefore no longer function correctly. For the open-loop example where the volume Bragg grating is placed at 1 mm from the laser stack 110, the dependence of the lasing on smile is less sensitive. However, the self-feedback drops to about 50% when the smile is only about 0.2 microns. Obtaining laser diode bars with reliably less than about 0.2 microns of smile can be difficult and expensive. Current state-of-art single diode arrays have about 0.5 to 1 micron of smile. Single arrays can be optically stacked to form a stack. The amount of smile limits the performance of the wavelength beam combining system. When single arrays are mechanically mounted in one piece to form a stack the state-of-art smile of each array in the stack is about 1 to 2 microns. Most common off-the-shelf stacks are mounted mechanically. In mechanically stacked form even if the smile is zero there will usually be pointing error after placement of the collimation cylindrical lens 120. Assuming the array in the stack has zero smile if the cylindrical lens is offset by 0.3 micron then effectively the whole array has 0.3 micron of smile. Thus, all the elements in the array will not perform properly since the effective feedback is essentially zero. Current state-of-art collimation error of diode arrays and stacks is about 1 micron offset. Thus, conventional wavelength beam combining is severely limited by the quality of packaging of diode arrays and stacks. Furthermore, due to problems with smile and alignment that reduce self-feedback, the laser cavity may be very sensitive to how the diode bars are placed, making the production of reliable, and robust wavelength beam combiners difficult and expensive.

According to one embodiment, there is provided a wavelength-beam-combining technique and architecture capable of fully compensating for both smile and pointing error and which may be used to enhance the power and brightness of laser diode arrays and stacks. In one embodiment, a one-dimensional wavelength beam combining cavity comprises a two-dimensional laser stack in which wavelength beam combining is performed along the stacking dimension (or fast axis for diode lasers) of the array. Self-feedback in the cavity may be substantially independent of the amount of smile and pointing errors. In one example, the grating and output coupler automatically fully compensate for any error in smile and pointing error. In one example, the cavity addresses diffraction losses in the array dimension, as well as smile and pointing errors along the stacking dimension, as discussed further below.

Referring to FIG. 3, there is illustrated one example of a closed loop wavelength beam combining cavity 300. In the illustrated example, for clarity only three laser arrays 305 are shown stacked along the stacking dimension of the laser stack 310; however, it is to be appreciated that the invention is not so limited and the laser stack 310 may comprise any number of laser arrays 305. Each laser array 305 comprises a plurality of laser emitters 315 arranged side-by-side along the array dimension. In one example, the laser arrays are laser diode bars, each bar comprising one or more laser diode elements. In the case of laser diode arrays 305, each array/diode bar 305 may be collimated or lensed along the fast axis, or collimated in both fast axis and slow axis dimensions (not shown in FIG. 3). In one embodiment, the cavity comprises optical elements including a cylindrical imaging telescope 320 that comprises two cylindrical lenses 325a and 325b having focal lengths $f_1$ and $f_3$, respectively, and a cylindrical transform lens 330 with focal length $f_2$. The cavity may further comprise a diffraction grating 340 with dispersion along the stacking dimension, and a partially reflecting output coupler 350. Wavelength beam combining is performed along the stacking dimension. As discussed above, this is in contrast to the conventional wavelength beam combining cavity shown in FIG. 1A where the beam-combining dimension is along the array dimension.

Figure 4A:
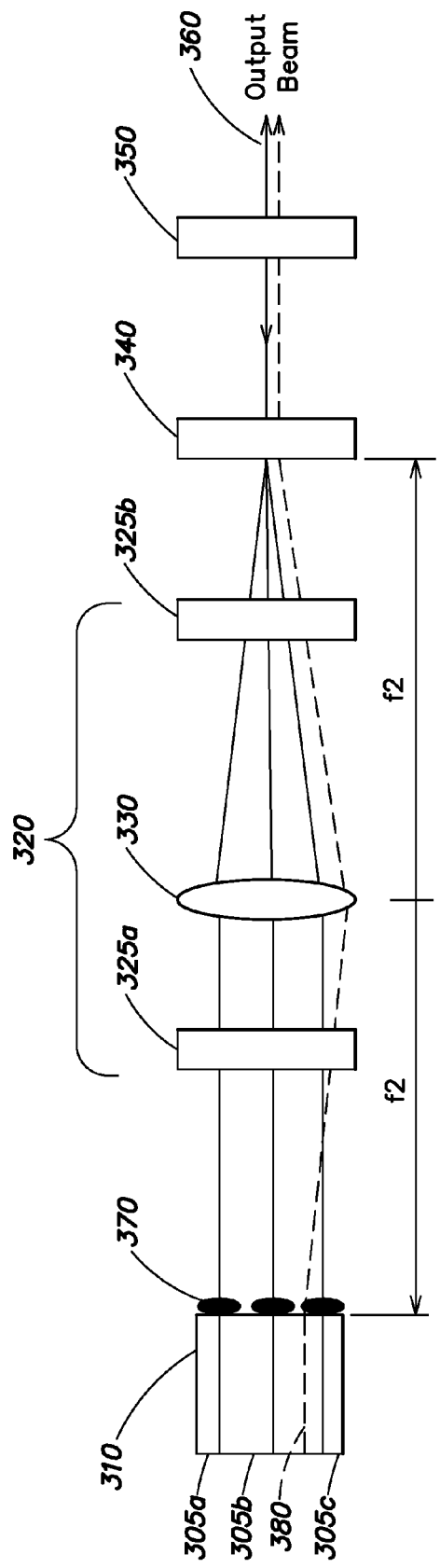
FIG. 4A is an optically equivalent diagram in the wavelength beam combining or stacking dimension of the cavity of FIG. 3, according to aspects of the invention.
Figure 4B:
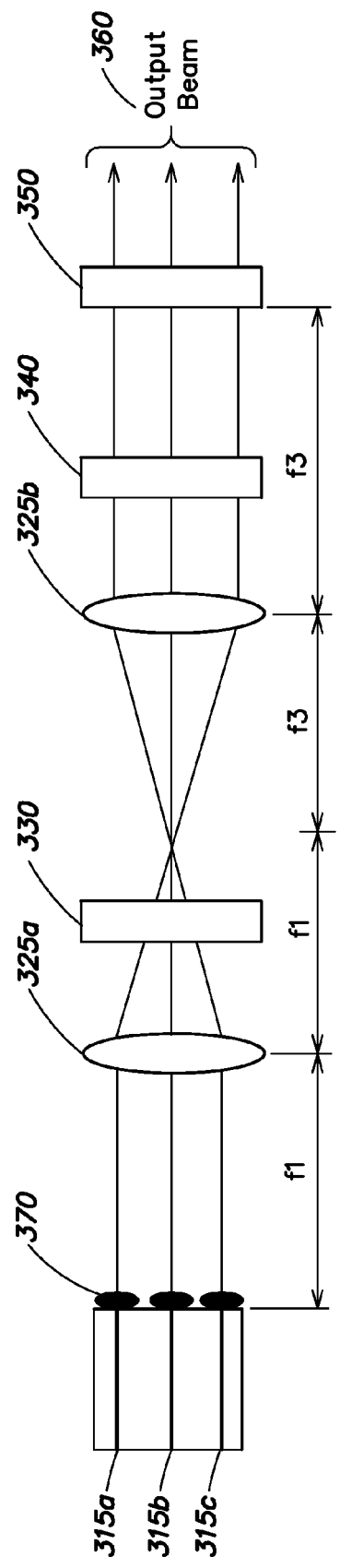
FIG. 4B is an optical diagram in the non-wavelength beam combining dimension or stacking dimension of the cavity of FIG. 3, according to aspects of the invention.

Referring to FIG. 4A, there is illustrated an optical equivalent in the stacking dimension (wavelength beam combining dimension) of the cavity of FIG. 3. The diffraction grating 340 is shown in FIG. 4A in transmission for clarity; however it is to be appreciated that the diffraction grating 340 may be in reflection, as in FIG. 3, or in transmission. As shown in FIG. 4A, collimating lenses 370 with focal length $f_m$ are used to collimate the laser arrays 305 of the laser stack 310. The illustrated example includes three laser arrays 305a, 305b and 305c; however, it is to be appreciated that the laser stack 310 may include any number of laser arrays 305 which may be stacked either mechanically or optically. In the case of laser diode stacks, pointing error occurs when the optical axis of the lens 370 is not aligned with the optical axis of the corresponding diode bar. As illustrated in FIG. 4B, in the array dimension, the cylindrical imaging telescope 320 (325a and 325b) collimates the optical beams from the emitters 315 to reduce optical losses along the array dimension caused by divergence in the optical beams produced by the emitters 315. As shown in FIG. 4A, in one embodiment, along the stacking or wavelength beam combining dimension, the cylindrical transform lens 330 spatially overlaps the beams from all the laser arrays 305 in the laser stack 310, including the beams from arrays (e.g., diode bars) with smile, onto the diffraction grating 340. The optical elements may be arranged such that the region of overlap of the optical beams from all the laser arrays is formed at the surface of the diffraction grating 340 and the partially reflecting output coupler 350 is placed on the path of the first-order diffracted beams from the diffraction grating 340. In one example, the cylindrical transform lens 330 is placed approximately focal length, $f_2$, from the laser stack 310 and from the diffraction grating 340. The focal length of the collimating lens 370 is usually very short compare to the focal lengths of the rest of the optical components. For example, the focal length $f_m$ of the collimating lenses 370 may typically be about 100 to 1000 times shorter that the focal lengths of the other optical components. The separation between collimating lens 370 and cylindrical transform lens 330 as shown in FIG. 4A is therefore $f_m+f_2$, which can be approximated as $f_2$ since $f_m$ is generally so small compared to $f_2$. Accordingly, in the following discussion, the contribution of collimating lenses 370 in term of placement of the optics very small and is essentially ignored. Thus, the distance between various optical components and the laser stack is approximated as the focal length of the respective optical component. Those skilled in the art will appreciate however, that the actual distance between the relevant optical component and the laser stack 310 also includes the focal length of the collimating lenses 320. The partially reflecting optical coupler 350 reflects a portion of each beam back toward the region of overlap, and the diffraction grating 340 then reflects light back to the laser stack 310. Thus, resonant cavity is formed between partially reflecting output coupler 350 and the back facets of the laser elements 315.

Referring to FIG. 4B, there is illustrated an optically equivalent diagram in the array (non-wavelength beam combining) dimension of the cavity of FIG. 3. In the illustrated example, each laser array 305 of the laser stack 310 includes three emitters 315a, 315b and 315c; however, it is to be appreciated that the laser arrays may include any number of emitters. In the array (non-wavelength-beam-combining) dimension, the cylindrical imaging telescope 320 images each laser emitter 315, along the slow axis of the emitter for diode emitters, onto the output coupler 350. The first element 325a of the cylindrical imaging telescope may be placed a first focal length $f_1$ from the laser stack 310. The second element 325b of the cylindrical imaging telescope may be placed a second focal length, $f_3$, from the output coupler 350. The distance between the first element 325a and the second element 325b is the sum of the focal lengths $f_1$ and $f_3$. As discussed above, $f_1$ and $f_3$ are the focal lengths of the first and second elements 325a, 325b, respectively, of the cylindrical imaging telescope 320. Along the array dimension, the cylindrical transform lens 330 and diffraction grating 340 do nothing. In FIG. 4A, the dashed line 380 illustrates optical paths from so-called "smile emitters," i.e., those emitters whose optical radiation deviates from an ideal path due to curvature of the diode bar (smile). According to one embodiment, all elements within a given diode bar, including elements with smile, will lase at nominally the same wavelength. Since there is a one to one correspondence between position and spectrum, this results in the broadening of the beam size in the array dimension after the output coupler 350, as shown in FIG. 4A. However, in the stacking dimension, the effective feedback for all the emitters with smile may be essentially 100%, independent of the amount of smile. This is because the resonant cavity operates in the stacking dimension, whereas smile is present in the array dimension, and thus, all emitters of a given diode bar are included within the resonant cavity, independent of smile. Thus, low-cost "off the shelf" diode bars and stacks may be used since the need for well-produced bars with minimal smile is obviated. By contrast, in conventional wavelength beam combiners where beam combining and cavity operation are in the same dimension as smile, namely, the array dimension, smile causes severe degradation in the self-feedback, as discussed above with reference to FIG. 2. In addition, the efficiency of the wavelength beam combining architecture along the fast axis will be greater than that of a conventional combining architecture since it has little or no dependence on smile and pointing errors.

As discussed above, important properties of a wavelength beam combining system include output spectrum, output beam quality, size, and efficiency. According to one embodiment, an architecture implementing wavelength beam combining along the fast axis using broad-area emitters has narrower output spectrum, better output beam quality, higher efficiency, and smaller size.

The output spectrum of a WBC cavity is given by:

$$\Delta\lambda \approx \frac{x}{f} g \cos\theta \quad (1)$$

In equation (1), x is the spatial dimension to be combined, f is the focal length of the transform lens (e.g., transform lens 330 in FIG. 3), g is the groove density of the grating 340, and θ is the angle of incidence of the light. The spatial dimension can be written as:

$$x = \frac{N*2*W*N.A.}{FF*N.A.} = \frac{N*2*BPP}{FF*N.A.} \quad (2)$$

In equation (2), N is the number of laser elements to be combined, W is the beam waist of the laser element, and FF is near-field fill factor. Beam parameter product (BPP) is defined as the beam waist multiplied by the numerical aperture (N.A.) or half-angle divergence of the laser element. The waists of common off-the-shelf broad-area emitters at 1 micron operating wavelength are generally about 0.5 micrometers (μm) along the fast axis and about 45 to 500 μm along the slow axis. In one example, the typical N.A. along the fast axis is about 0.5 radian, and about 0.1 radian along the slow-axis. Thus, the BPP along the fast axis is:

0.5 μm*0.5 rad≈0.25 mm.mrd

The BPP along the slow axis is:

45-500 μm*0.1 rad≈4.5 to 50 mm.mrd

The ratio of the two BPPs or 18 to 200 gives the spectral utilization improvement per laser element.

Thus assuming FF, N.A., N, f, g, and θ are the same for both an array-dimension wavelength beam combining (WBC) architecture (i.e., one that performs the wavelength beam combining along the array dimension) and a stacking-dimension WBC architecture (i.e., one that performs the wavelength beam combining along the stacking dimension), the output spectrum for WBC along the stacking dimension is 18 to 200 times (the ratio of the two BPPs) narrower. Alternatively, for a fixed output spectrum, the size of a stacking-dimension WBC architecture may be 20 times smaller assuming the ratio of the BPPs is 20. Narrow spectral bandwidth may be preferred, and thus the stacking dimension WBC architecture may offer a significant improvement in spectral bandwidth. Alternatively, if the output spectrum is fixed at the same width for both architectures, the size of the stacking-dimension WBC architecture according to embodiments of the invention can be 20 times smaller. Thus, a stacking-dimension WBC architecture may provide significant improvements in terms of size and/or output spectrum.

According to one embodiment, beam quality (B.Q.) can be defined as:

$$B.Q. = \frac{N*BPP_e}{FF} \quad (3)$$

In equation (3), $BPP_e$ is the BPP of the emitter. The composite output beam quality (namely, the product of the BPP along the fast axis and the BPP along the slow axis) for a conventional WBC architecture is given by:

$$B.Q.(\text{product}) = BPP_s * \frac{N_B * BPP_F}{FF_F} = 2.5*(mm.mrd)^2 * N_B \quad (4)$$

In equation (4), we assume $FF_F$=0.5 is the fill-factor along the array dimension, $BPP_S$=5 mm mrd is the BPP of the emitter along the slow axis, $N_B$ is the number diode bars, and $BPP_F$=0.25 mm mrd is the BPP of each diode bar along the fast axis. The composite output beam quality (namely, the product of the BPP along the fast axis and the BPP along the slow axis) for a stacking-dimension WBC architecture according to one embodiment is given by:

$$B.Q.(\text{product}) = BPP_F * \frac{N_E * BPP_S}{FF_E} = 2.5*(mm.mrd)^2 * N_E \quad (5)$$

In equation (5), $FF_F$=0.5 is the fill-factor along the array dimension and $N_E$ is the number of emitters per bar. Thus, if the number of bars is the same as the number of emitters, then the output beam quality is substantially the same for both architectures. In practice, however, it is presently more practical to have a much larger number of diode bars than of emitters per bar. In this case, the output beam quality may be substantially improved using embodiments of the stacking-dimension WBC architecture.

Tables 1-4 below illustrate some comparisons between different configurations of a conventional array-dimension WBC architecture and examples of a stacking-dimension WBC architecture according to aspects of the invention. In all comparisons any degradation of output beam quality due to optical components and mechanical errors is ignored as the degradation affects both architectures similarly For each of the examples illustrated in Tables 1-4, the following assumptions apply:

f=200 mm, g=1800 l/mm, and

θ=60 degrees.

Table 1 compares a conventional array-dimension WBC system using a single 1-cm wide diode bar comprising 49 broad area laser elements to an example of a stacking-dimension WBC system using 49 diode bars, each bar comprising 1 emitter. The fill factor for both systems is 50%. Calculations are based on the equations given above. The spectral linewidth, Δλ, of the output spectrum is calculated using equation (1). The dimension x=10 mm is assumed for conventional WBC and x=10 mm/20 (where 20 is the ratio of the BPP) is assumed for WBC along the stacking dimension.

TABLE 1

Comparing 49-emitter, 1-bar stack (1 cm wide bar, 50% fill factor) conventional WBC with 1-emitter, 49-bar stack (50% fill factor) stacking-dimension WBC.

|  | Conventional array-dimension WBC | Stacking-dimension WBC |
|---|---|---|
| Output beam quality (mm.mrd) | WBC = 5, Non-WBC = 0.25, Product = 1.25 | WBC = 0.25, Non-WBC = 5, Product = 1.25 |
| Output spectrum (nm) | 13.9 | 0.695 |
| Size (transform optics) | Same | Same |
| Output power | High | Higher |
| Efficiency | High | Higher |

As can be seen from Table 1, in this example, the overall output beam quality (product of both axes) of both architectures is the same. The output spectrum, however, is 20 times narrower in the stacking-dimension WBC architecture. The size of the transform optics and output power is substantially similar for both architectures. The stacking-dimension WBC architecture has higher efficiency. For brightness scaling the number of bars can be increased as needed. On the other hand if the output spectrum is held fixed for both WBC configurations the focal length of the transform optics for the new WBC architecture can be 20 times shorter.

Table 2 compares a 49-bar stack comprising 49 1-cm wide diode bars, each bar including 49 broad-area laser elements using conventional WBC and an example of a stacking-dimension WBC. The fill factor in both dimensions is 50%. This fill factor is typical of common off-the-shelf diode bars and stacks. The calculations are based on the equations given above. The dimension x=10 mm is assumed for conventional WBC and x=10 mm/20 (where 20 is the ratio of the BPP) is assumed for WBC along the stacking dimension.

TABLE 2

Comparing conventional WBC with stacking-dimension WBC, each using a 49-emitter, 49-bar stack (1 cm wide bar, 50% array and stack fill factor)

|  | Conventional array-dimension WBC | Stacking-dimension WBC |
|---|---|---|
| Output beam quality (mm.mrd) | WBC = 5, Non-WBC = 24.5, Product = 122.5 | WBC = 0.25, Non-WBC = 490, Product = 122.5 |
| Output spectrum (nm) | 13.9 | 0.695 |
| Size (transform optics) | Same | Same |
| Output power | High | Higher |
| Efficiency | High | Higher |

As can be seen from Table 2, in this example, the overall output beam quality (product of both axes) of both architectures is the same. The output spectrum, however, is 20 times narrower for the stacking-dimension WBC architecture. The size of the transform optics and output power is the substantially similar for both systems. On the other hand if the output spectrum is held fixed for both WBC configurations the focal length of the transform optics for the new WBC architecture can be 20 time shorter.

Table 3 compares a conventional WBC system and an example of a stacking-dimension WBC system, each system using a 980-bar stack comprising 980 1-cm wide diode bars with each bar comprising 49 broad-area laser elements. The fill factor in both dimensions is 50%. The calculations are based on the equations given above. The dimension x=10 mm is assumed for both WBC architectures.

TABLE 3

Comparing a conventional WBC system with a stacking-dimension WBC system, each using a 49-emitter, 980-bar stack (1 cm wide bar, 50% array and stack fill factor)

|  | Conventional array-dimension WBC | Stacking-dimension WBC |
|---|---|---|
| Output beam quality (mm.mrd) | WBC = 5, Non-WBC = 490 Product = 2450 | WBC = 0.25, Non-WBC = 490, Product = 122.5 |
| Output spectrum (nm) | 13.9 | 13.9 |
| Size (transform optics) | Same | Same |
| Output power | High | Higher |
| Efficiency | High | Higher |

As can be seen in Table 3, in this example, the output spectrum has the same linewidth in both systems. The output beam quality of the stacking-dimension WBC system, however, is 20 times better. The size and output power is substantially similar for both systems. In this example, using common off-the-shelf diode bars of 200 W per bar, up to 196,000 W (assuming 100% beam combining efficiency), may be extracted from the cavity.

Table 4 compares a conventional WBC system and an example of a stacking-dimension WBC system, each system using a 100-bar stack comprising 100 1-cm wide diode bars with each bar including 49 broad-area elements. The fill factor in both dimensions is 50%. The calculations are based on the equations given above.

TABLE 4

Comparing a conventional WBC system with a stacking-dimension WBC system, each using a 49-emitter, 100-bar stack (1 cm wide bar, 50% array and stack fill factor)

|  | Conventional array-dimension WBC | Stacking-dimension WBC |
|---|---|---|
| Output beam quality (mm.mrd) | WBC = 5, Non-WBC = 50 Product = 250 | WBC = 0.25, Non-WBC = 490, Product = 122.5 |
| Output spectrum (nm) | 13.9 | 1.4 |
| Size (transform optics) | Same | Same |
| Output power | High | Higher |
| Efficiency | High | Higher |

As can be seen in Table 4, in this example, both the output beam quality and output spectrum of the stacking-dimension WBC architecture are improved relative to the conventional architecture. The size and output power is substantially similar for both systems.

The above examples illustrate that embodiments of stacking-dimension wavelength beam combining cavities according to aspects of the invention may provide improvements in several important characteristics of the cavity, including output spectrum, output beam quality, size and efficiency. In addition, as discussed above, because wavelength beam combining in the stacking dimension is insensitive to smile, common off-the-shelf diode bars may be used; thus allowing a high performance and yet low cost system to be implemented.

Figure 5A:
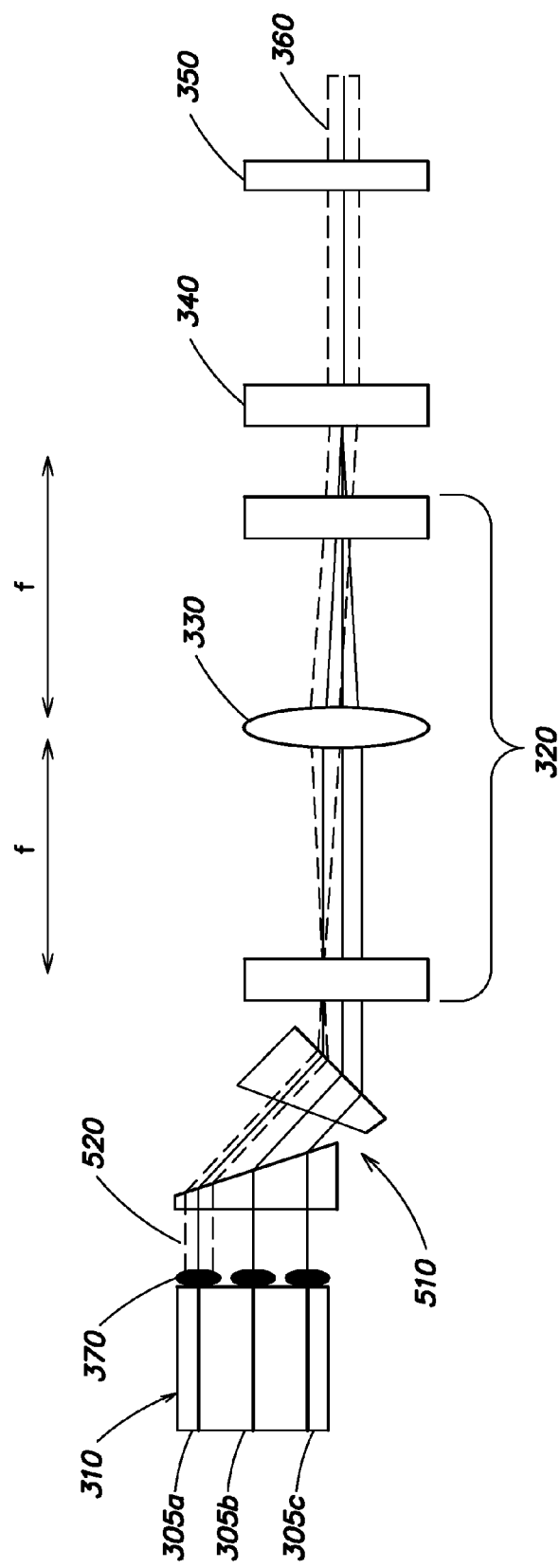
FIG. 5A is an optically equivalent diagram in the wavelength beam combining or stacking dimension of one example of a closed-loop one-dimensional wavelength beam combining cavity according to aspects of the invention.
Figure 5B:
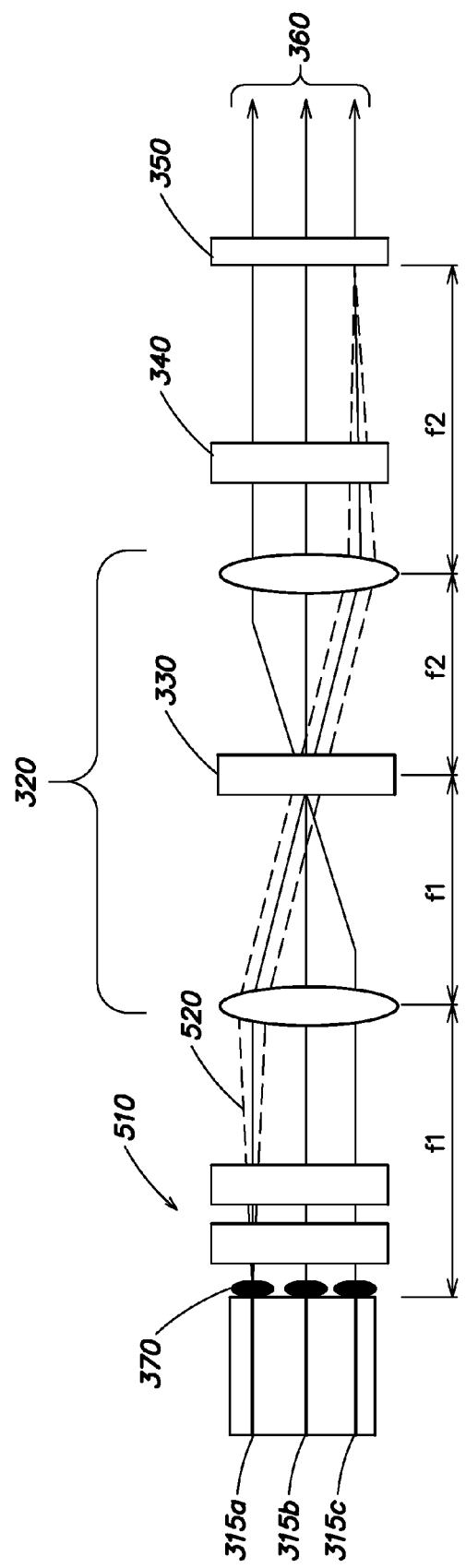
FIG. 5B is an optically equivalent diagram in the non-wavelength beam combining or array dimension of the example cavity of FIG. 5A.

Referring to FIG. 5A, there is illustrated an optically equivalent diagram in the stacking dimension (wavelength beam combining dimension) of another example of a closed-loop one-dimensional wavelength beam combining cavity according to one embodiment. In this example, the wavelength beam combining cavity includes an anamorphic beam expander 510. In the stacking dimension, the anamorphic beam expander 510 functions to reduce the size of the beam 520 and the stacking dimension, as illustrated in FIG. 5A. By making the beam of each array smaller, the beams will diverge more, and the larger diverged beam is collimated in the stacking dimension by the cylindrical transform lens 330. Thus, the beam size at the grating 340 is larger. Accordingly, the power density of the beam incident on the grating 340 is lower, thus reducing the potential that the beam may damage the grating. In addition, by reducing the size in the stacking dimension, the spectral bandwidth of the system is also reduced. FIG. 5B illustrates an optical equivalent of the diagram of FIG. 5A in the array (non-wavelength beam combining) dimension. In one example, the anamorphic beam combiner 510 does not reduce the beam size along the array dimension. It is to be appreciated that although the divergence and convergence of the beam is illustrated only for one laser array 305a or laser emitter 315a, the elements of the cavity operate similarly on the beams from each diode bar and each emitter. In FIGS. 5A and 5B, the dashed line illustrates the divergence of the laser beam along the fast and slow axis.

Figure 6B:
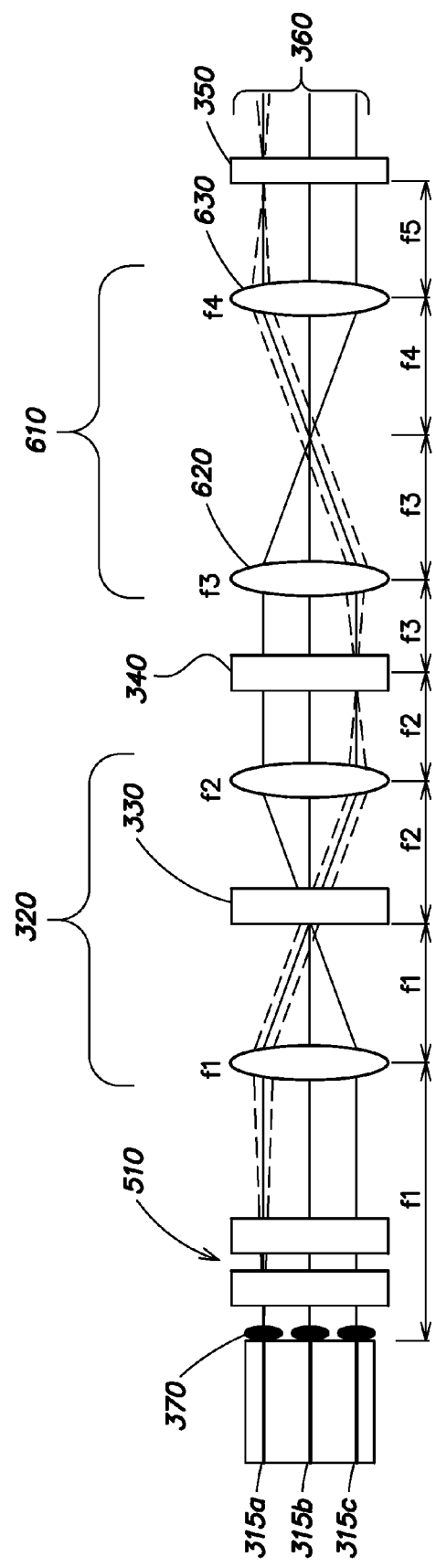
FIG. 6B is an optically equivalent diagram in the non-wavelength beam combining or array dimension of the example cavity of FIG. 6A.

Referring to FIG. 6A, there is illustrated optically equivalent diagram in the stacking dimension (wavelength beam combining dimension) of another example of a closed-loop one-dimensional wavelength beam combining cavity. FIG. 6B illustrates the corresponding optically equivalent diagram in the array (non-wavelength beam combining) dimension for the same cavity as shown in FIG. 6A. In the example shown in FIGS. 6A and 6B, the cavity includes an anamorphic beam expander 510, as discussed above. An additional cylindrical telescope 610 is disposed between the grating 340 and the output coupler 350. As shown in FIG. 6B, in the array dimension, the first element 620 of the additional cylindrical telescope 610 has a focal length $f_3$ and the second element 630 has a focal length $f_4$. In one example, the first cylindrical imaging telescope 320, with components 325a and 325b having focal lengths $f_1$ and $f_2$, respectively, images the array of laser elements onto the diffraction grating 340. The additional cylindrical imaging telescope 610 images the image on the grating 340 onto the output coupler 350. In examples in which the grating 340 is in transmission, having two cylindrical imaging telescopes 320, 610 reduces loss and supports robust operation of the cavity. In examples in which the grating 340 is reflective, one cylindrical imaging telescope 320 may be double-passed and used without the additional cylindrical telescope 610.

Figure 7A:
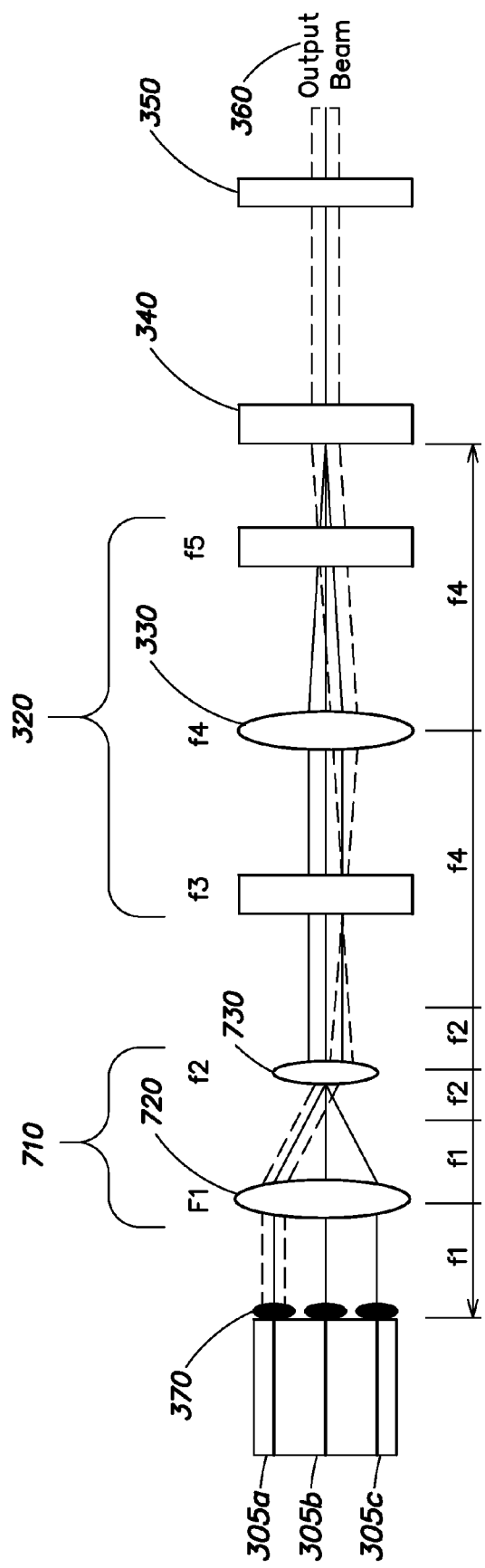
FIG. 7A is an optically equivalent diagram in the wavelength beam combining or stacking dimension of another example of a closed-loop one-dimensional wavelength beam combining cavity according to aspects of the invention.
Figure 7B:
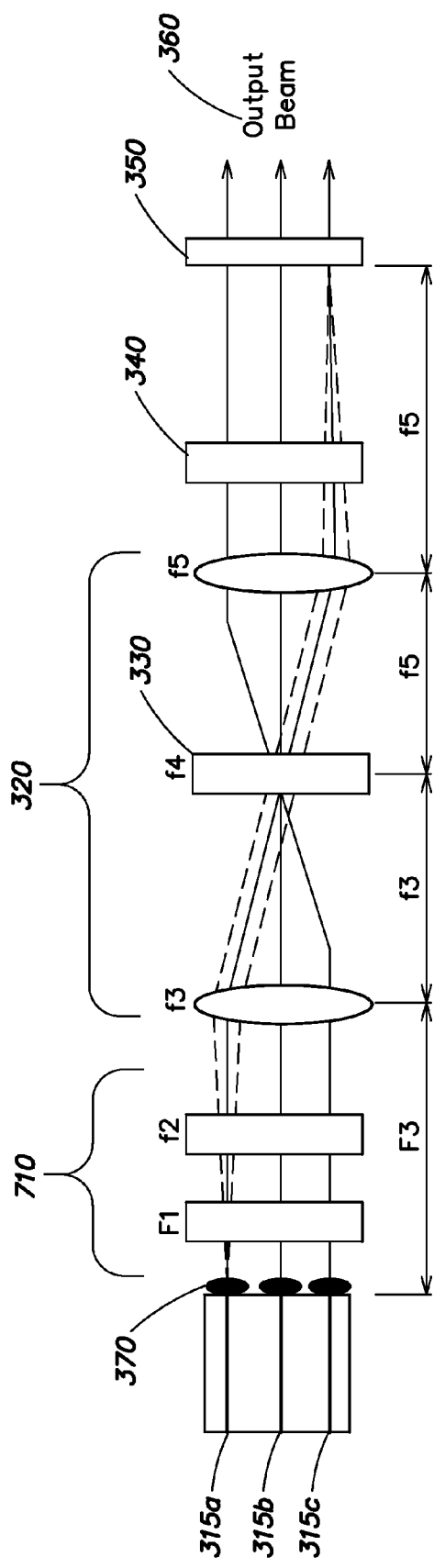
FIG. 7B is an optically equivalent diagram in the non-wavelength beam combining or array dimension of the example cavity of FIG. 7A.

Referring to FIG. 7A, there is illustrated optically equivalent diagram in the stacking dimension (wavelength beam combining dimension) of another example of a closed-loop one-dimensional wavelength beam combining cavity. FIG. 7B illustrates the corresponding optically equivalent diagram in the array (non-wavelength beam combining) dimension for the same cavity as shown in FIG. 7A. In the example illustrated in FIGS. 7A and 7B, an additional cylindrical telescope 710 serves a similar function to the anamorphic beam expander discussed above with reference to FIGS. 6A and 6B. The additional cylindrical telescope 710 may comprise two lenses 720 and 730, as illustrated, having focal lengths $f_1$ and $f_2$, respectively.

Figure 8A:
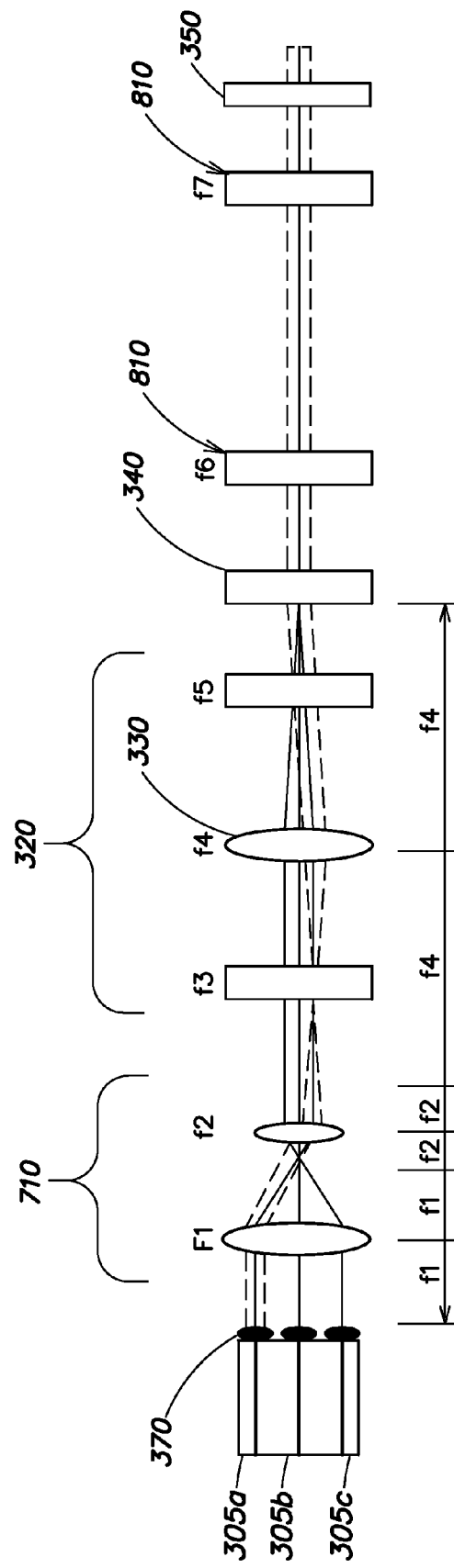
FIG. 8A is an optically equivalent diagram in the wavelength beam combining or stacking dimension of another example of a closed-loop one-dimensional wavelength beam combining cavity according to aspects of the invention.
Figure 8B:
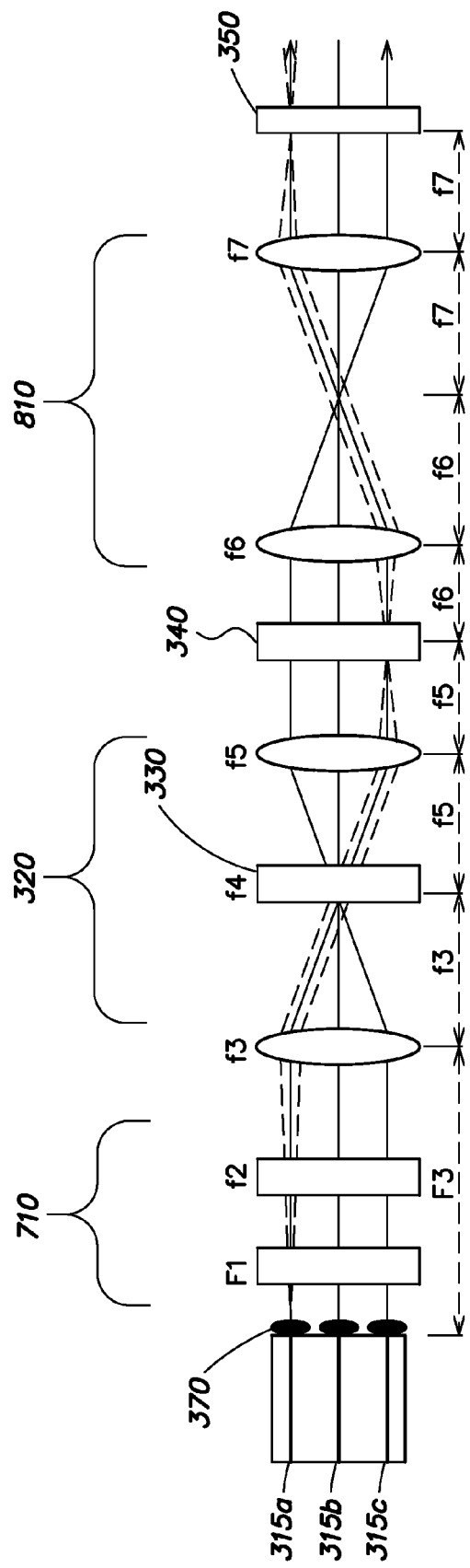
FIG. 8B is an optically equivalent diagram in the non-wavelength beam combining or array dimension of the example cavity of FIG. 8A.

FIGS. 8A and 8B illustrate, in the stacking and array dimensions respectively, another example of a wavelength beam combining closed-loop cavity according to one embodiment. Wavelength beam combining is again performed along the stacking dimension. In the example illustrated in FIGS. 8A and 8B, the system includes the second cylindrical telescope 710 which may function similarly to the anamorphic beam expander, as discussed above, as well as a third cylindrical telescope 810 disposed between the grating 340 and the output coupler 350. As discussed above with reference to FIGS. 6A and 6B, the cylindrical imaging telescope 320 images the laser elements along the array dimension onto the diffraction grating 340, and the third cylindrical telescope 810 images the image on the grating 340 onto the output coupler 350.

Figure 9A:
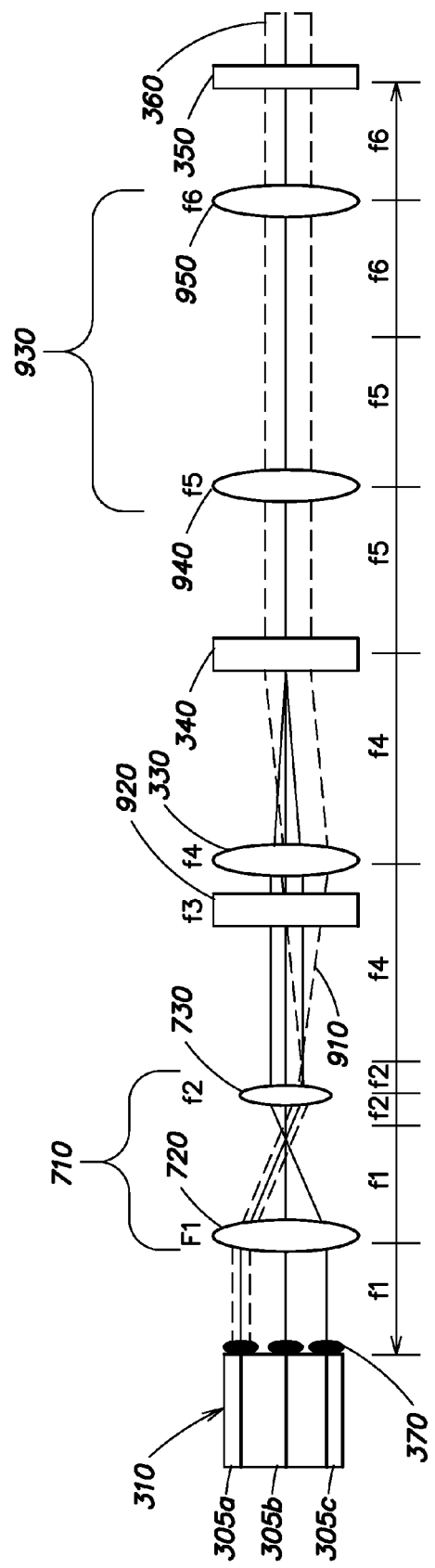
FIG. 9A is an optically equivalent diagram in the wavelength beam combining or stacking dimension of another example of a closed-loop one-dimensional wavelength beam combining cavity according to aspects of the invention.
Figure 9B:
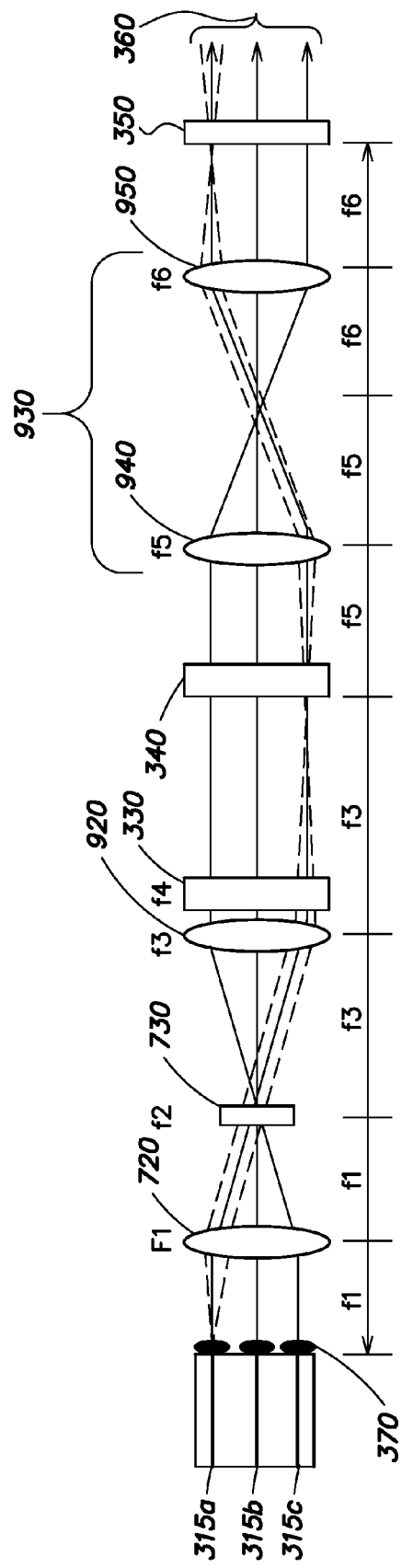
FIG. 9B is an optically equivalent diagram in the non-wavelength beam combining or array dimension of the example cavity of FIG. 9A.

Referring to FIGS. 9A and 9B, there is illustrated another example of a closed loop wavelength beam combining cavity according to one embodiment, in which wavelength beam combining is again performed along the stacking dimension. FIG. 9A illustrates an optically equivalent diagram of the cavity in the stacking dimension and FIG. 9B illustrates an optically equivalent diagram of the cavity in the array dimension. In one example, the wavelength beam combining system comprises a cylindrical telescope 710 which serves to reduce the size of the optical beams in the stacking dimension, causing the beam to diverge more, as discussed above with reference to FIGS. 7A and 7B and illustrated (see beam 910(in FIG. 9A. In one example, the first lens 720 is a spherical lens, rather than a cylindrical lens. Spherical lenses may be presently preferred in some applications because they may provide better quality at lower cost than an equivalent cylindrical lens. The second lens 730 may be a cylindrical lens. The system further comprises a cylindrical imaging lens 920 which images the emitters onto the grating 340 along the array dimension, as shown in FIG. 9B. In this example, the imaging lens 920 replaces the cylindrical imaging telescope 320, combining the two elements 325a, 325b of the cylindrical imaging telescope 320 into one lens 920. In addition, in the illustrated example, the system comprises an imaging telescope 930 that images the image on the grating 340 onto the output coupler 350. In one example, the imaging telescope 930 comprises two lenses 940, 950, each of which is a spherical lens.

Figure 10:
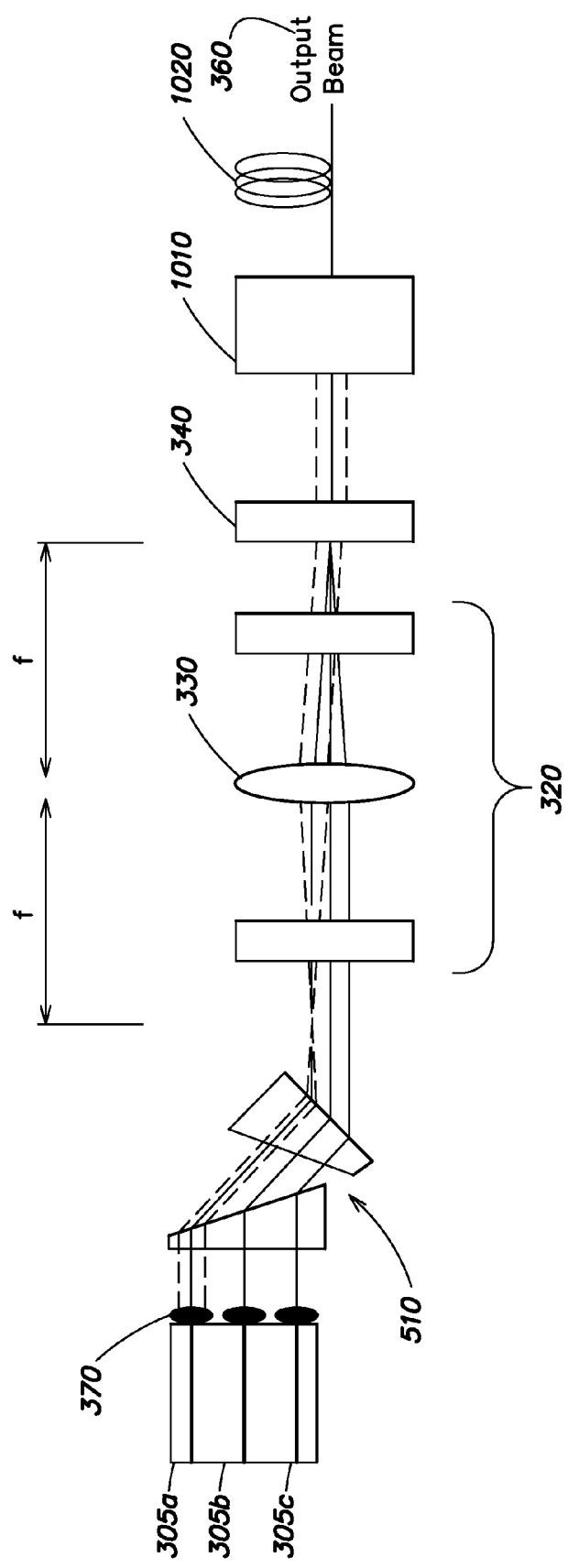
FIG. 10 is an optically equivalent diagram in the wavelength beam combining or stacking dimension of another example of a closed-loop one-dimensional wavelength beam combining cavity according to aspects of the invention.

According to another embodiment, an efficient, high brightness laser source may be achieved using an optical fiber as an output coupler. Accordingly, referring to FIG. 10 there is illustrated, in the stacking dimension, one example of a stacking-dimension wavelength beam combining system including a mechanism for coupling the output beam 360 into an optical fiber 1020. In one example, the system comprises beam focusing optics 1010 and a passive fiber output coupler 1020 replacing the output coupler 350 discussed above. The fiber is partially reflective. The resonant cavity is formed between the back facet of the laser elements 305 and the partially reflective fiber 1020. It will be appreciated by those skilled in the art, given the benefit of this disclosure, that the beam focusing optics 1010 and passive fiber output coupler 1020 may be used with a variety of different systems, including any of the example systems illustrated in FIGS. 3-9B.

Figure 11A:
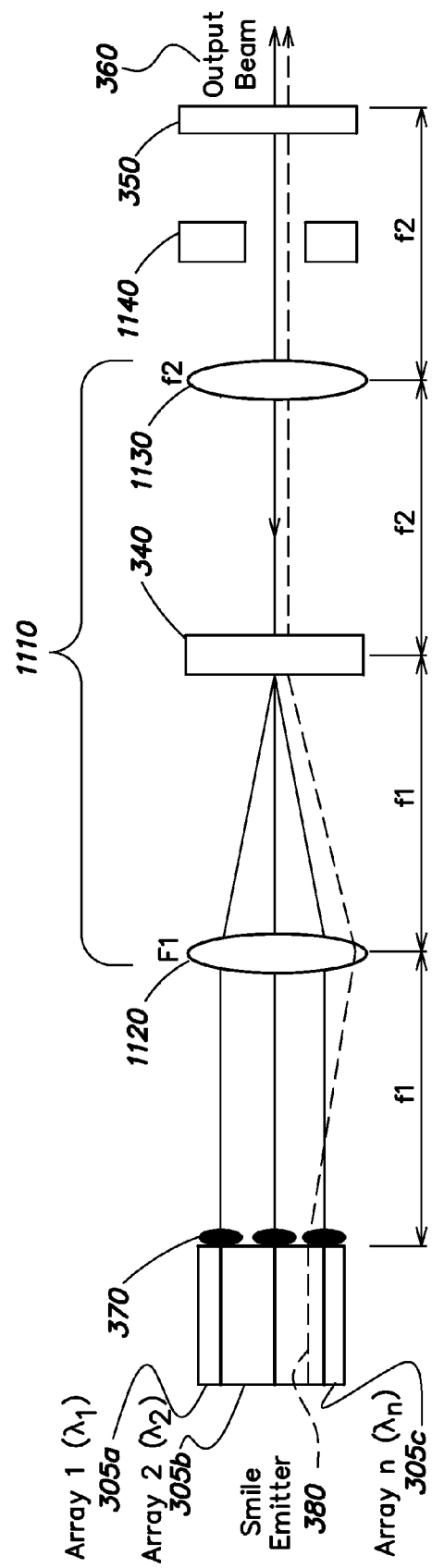
FIG. 11A is an optical diagram in the wavelength beam combining or stacking dimension of another example of a closed-loop one-dimensional wavelength beam combining cavity according to aspects of the invention.
Figure 11B:
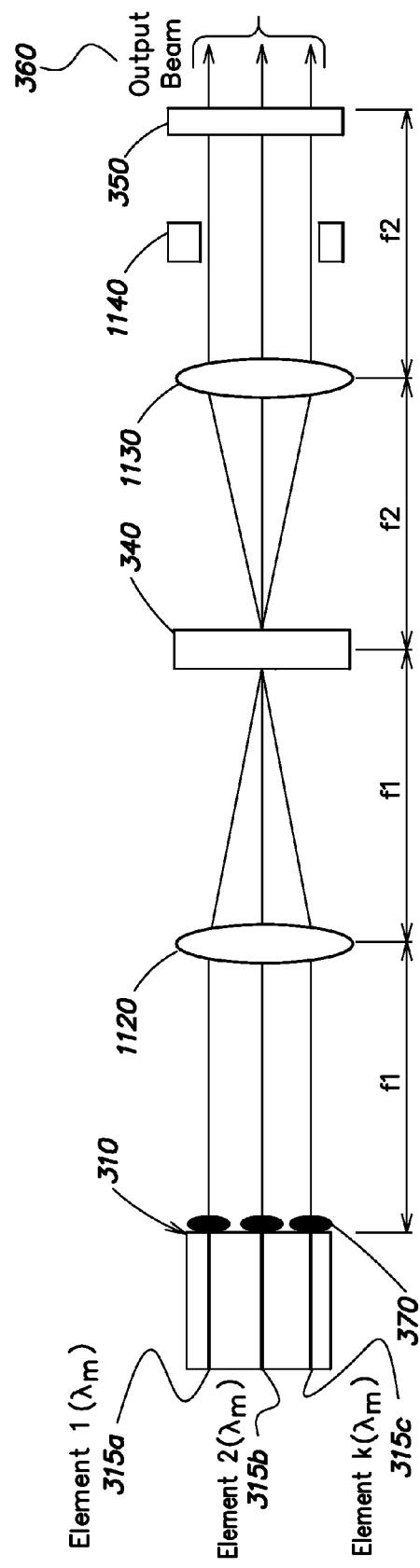
FIG. 11B is an optically equivalent diagram in the non-wavelength beam combining or array dimension of the example cavity of FIG. 11A.

Another example of a closed-loop one-dimensional wavelength beam combining cavity according to one embodiment is illustrated in FIGS. 11A and 11B. FIG. 11A illustrates the cavity in the stacking or wavelength-beam-combining dimension, and FIG. 11B is an optically equivalent diagram of the cavity in the array (non-wavelength-beam-combining) dimension. As discussed above, in FIG. 11A, the dashed line represents the optical beam from a laser array 380 suffering from smile In this embodiment, the cavity comprises a telescope 1110 that comprises two spherical lenses 1120 and 1130. Because the lens 1120 is a spherical lens, it may act on the optical beams from the laser stack 310 in both the stacking and array dimensions. Accordingly, the lens 1120 may act both as part of the telescope 1110 and as a spherical transform lens, removing the need for the cylindrical transform lens 330 used in other embodiments. In one example, the spherical lens element 1120 has a focal length, $f_1$, and is positioned one focal length from both the laser stack 310 and the grating 340.

The cavity also comprises a slit 1140 positioned between the lens element 1130 and the output coupler 350. The purpose of the slit 1140 is to reduce cross optical talk between the laser arrays or bars.

Figure 12A:
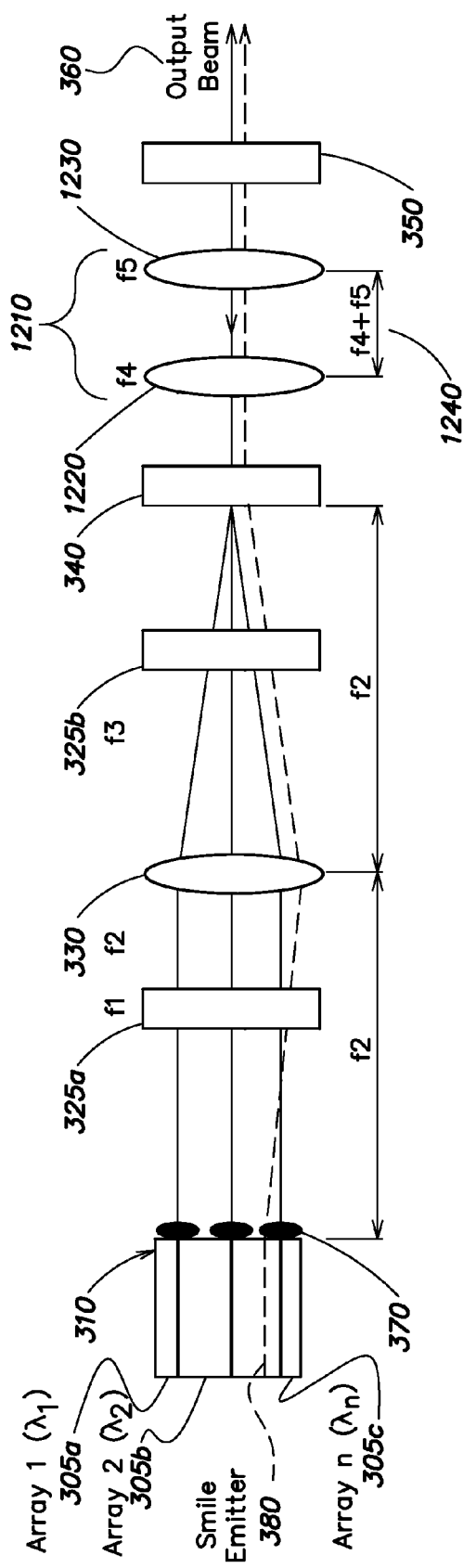
FIG. 12A is an optical diagram in the wavelength beam combining or stacking dimension of another example of a closed-loop one-dimensional wavelength beam combining cavity according to aspects of the invention.
Figure 12B:
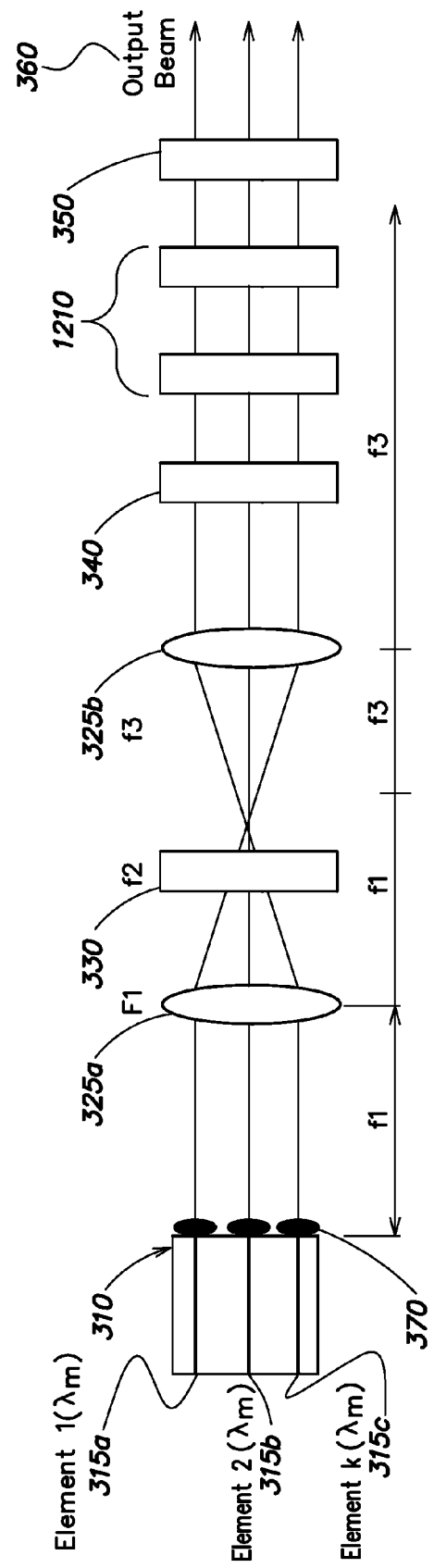
FIG. 12B is an optically equivalent diagram in the non-wavelength beam combining or array dimension of the example cavity of FIG. 12A.

Referring to FIGS. 12A and 12B, there is illustrated another example of a closed-loop one-dimensional wavelength beam combining cavity according to one embodiment. FIG. 12A illustrates the cavity in the stacking or wavelength-beam-combining dimension, and FIG. 12B is an optically equivalent diagram of the cavity in the array (non-wavelength-beam-combining) dimension. In this example, the cavity comprises a cylindrical telescope 1210 positioned between the grating 340 and the output coupler 350. The cylindrical telescope comprises first and second cylindrical lens elements 1220 and 1230, respectively. In the stacking dimension, illustrated in FIG. 12A, the first cylindrical lens element 1220 has a focal length $f_4$ and the second cylindrical lens element has a focal length $f_5$. In one example, the two cylindrical lens elements 1220 and 1230 are positioned a distance 1240 apart, this distance being approximately equal to the sum of the focal lengths of the two cylindrical lens elements $(f_4+f_5)$. The cylindrical telescope 1210 operates to reduce beam size along the wavelength beam combining or stacking dimension and optical crosstalk in the output beam 360.

Figure 13:
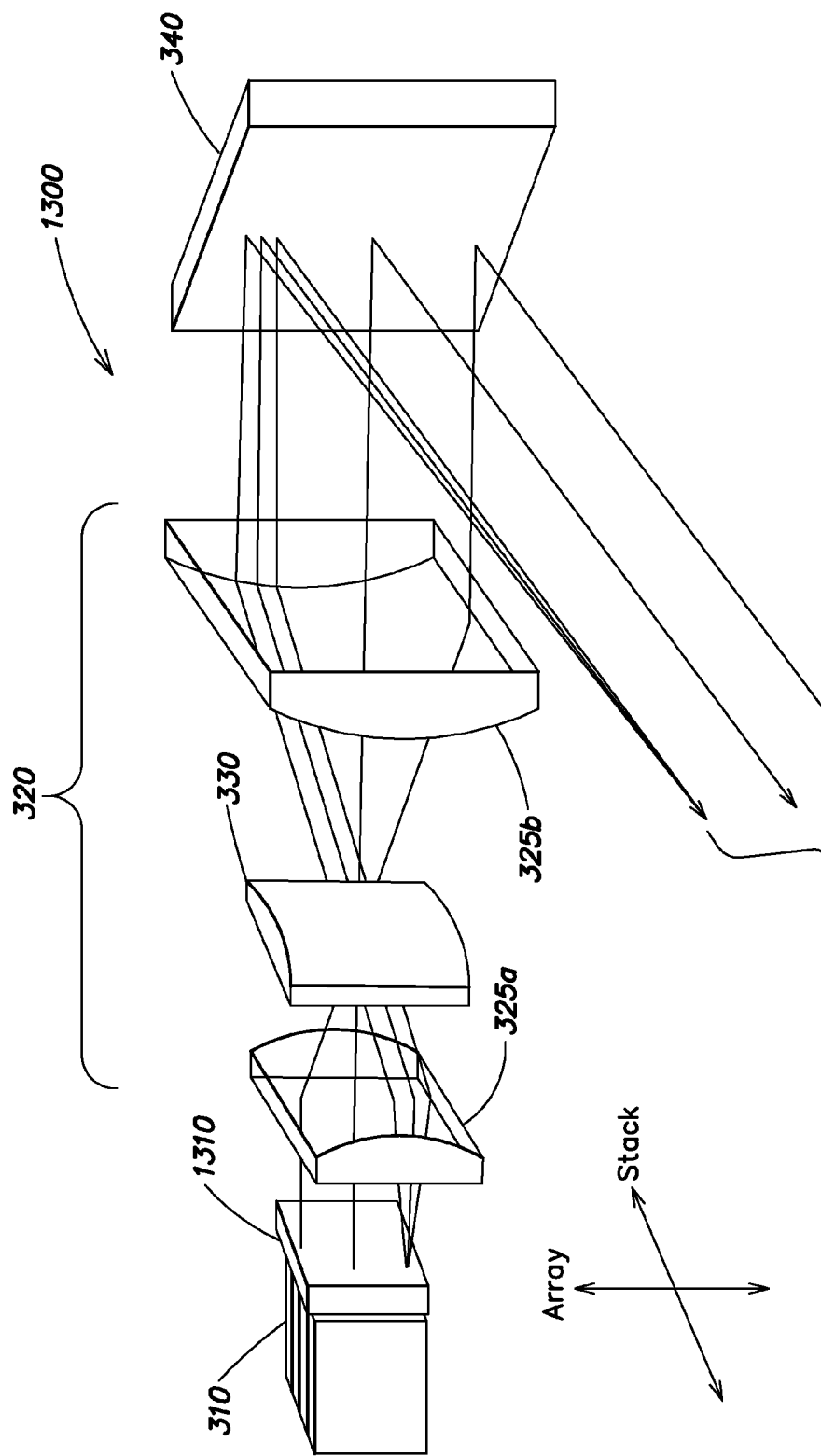
FIG. 13 is a diagram of one example of an open-loop one-dimensional wavelength beam combining cavity according to aspects of the invention.

In the embodiments discussed above with reference to FIGS. 3-12B, wavelength stabilization is accomplished using the diffraction grating 340 and output coupler 350. Referring to FIG. 13, there is illustrated an example of an open-loop one dimensional wavelength beam combining cavity 1300 in which wavelength stabilization is accomplished using a wavelength-chirped volume Bragg grating (VBG) 1310. The wavelength is chirped along the stacking dimension. In one embodiment, the cavity comprises optical elements including the wavelength chirped VBG 1310, a cylindrical imaging telescope 320, a cylindrical transform lens 330, and a diffraction grating 340 with dispersion along the stacking dimension. Wavelength beam combining is along the stacking dimension. The cylindrical imaging telescope 320 images the emitters along the array dimension and operates to eliminate or reduce conical diffraction from the diffraction grating 340. Conical diffraction degrades beam quality of the output beam 360.

Figure 14A:
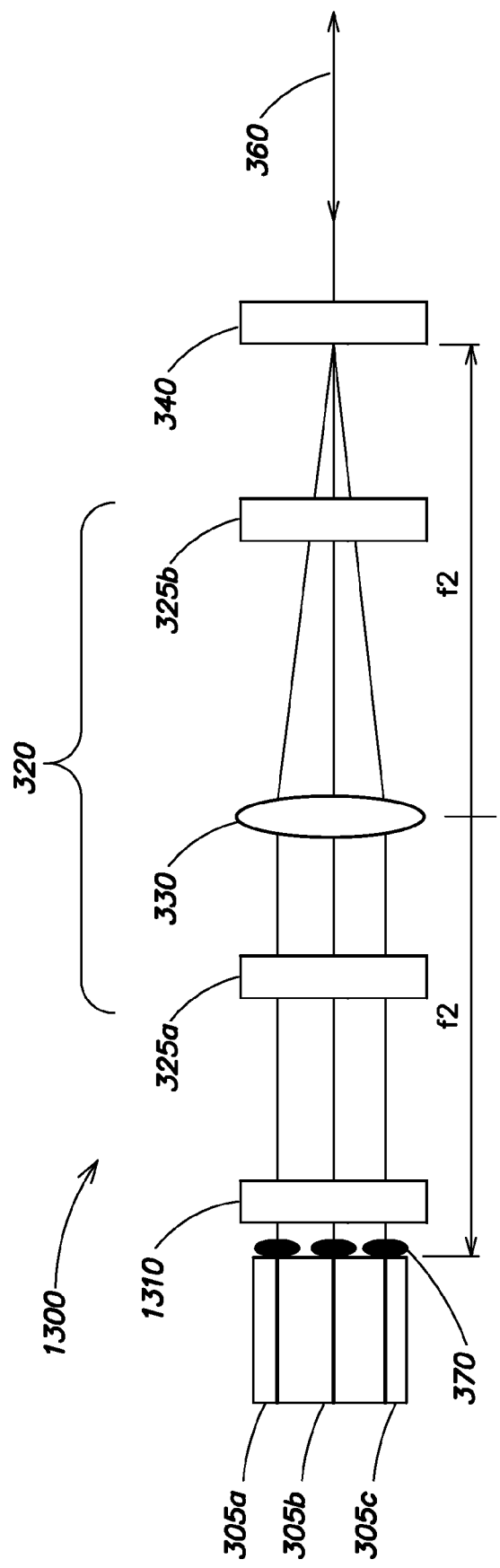
FIG. 14A is an optical equivalent diagram in the wavelength beam combining or stacking dimension of another example of an open-loop one-dimensional wavelength beam combining cavity according to aspects of the invention.
Figure 14B:
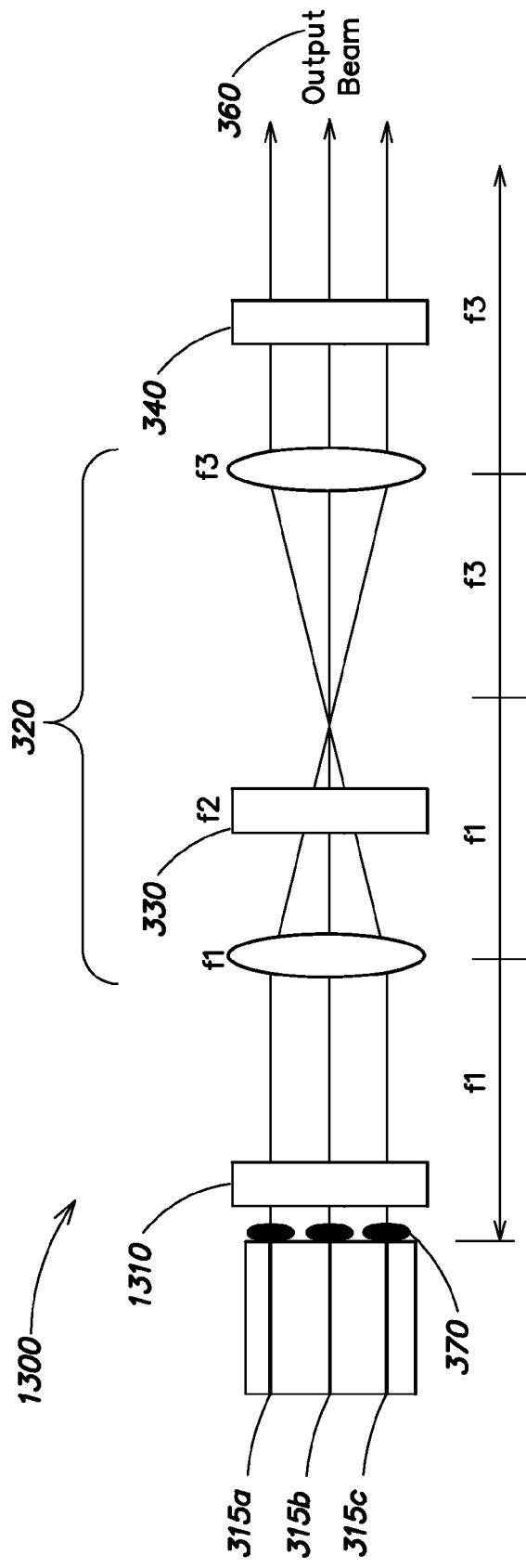
FIG. 14B is an optical equivalent diagram in the non-wavelength beam combining or array dimension of the example cavity of FIG. 14A.
Figure 15A:
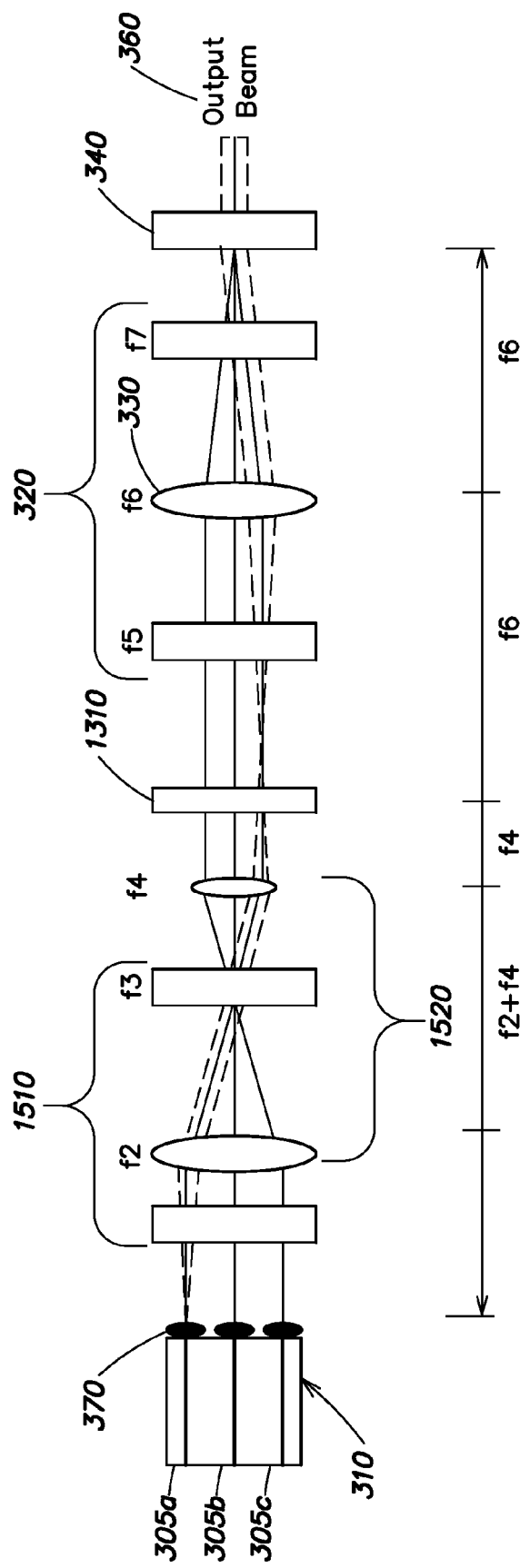
FIG. 15A is an optical equivalent diagram in the wavelength beam combining or stacking dimension of another example of an open-loop one-dimensional wavelength beam combining cavity according to aspects of the invention.
Figure 15B:
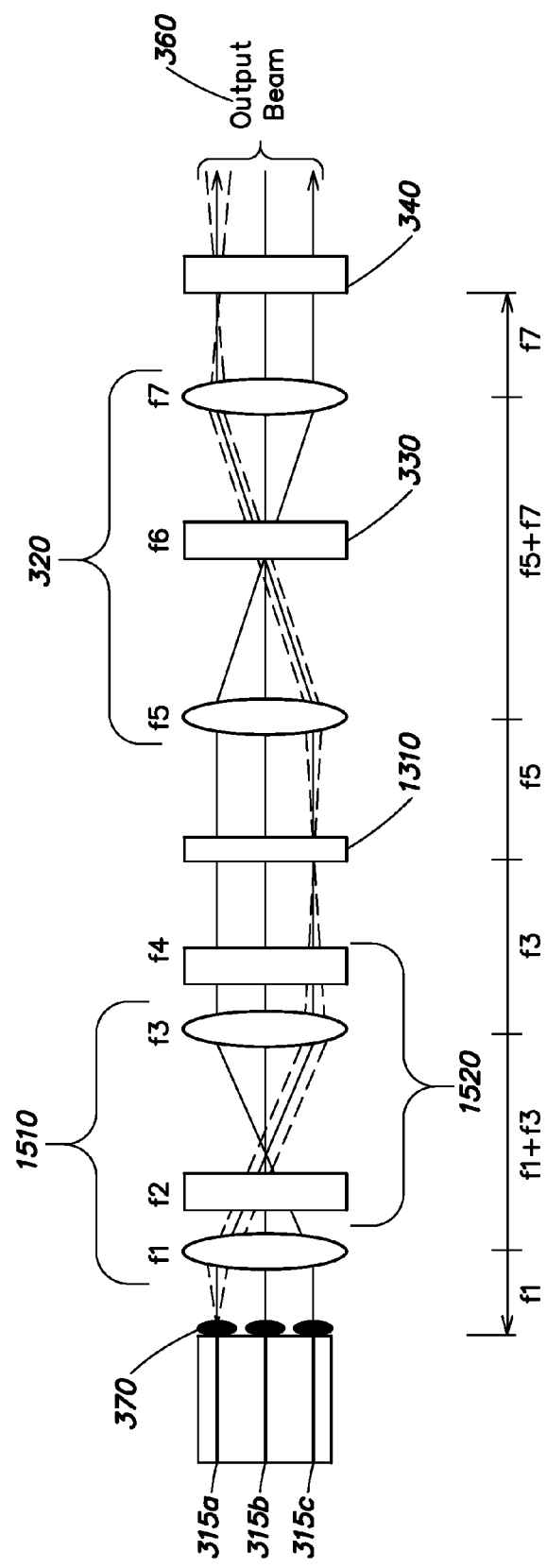
FIG. 15B is an optical equivalent diagram in the non-wavelength beam combining or array dimension of the example cavity of FIG. 15A.

Referring to FIG. 14A, there is illustrated an optical equivalent in the stacking (wavelength beam combining) dimension of the cavity of FIG. 13, with the diffraction grating 340 shown in transmission. In the cavity 1300, the wavelength of each laser array 305 is stabilized to a unique wavelength using the wavelength-chirped VBG 1310. For example, a first laser array 305a in the laser stack 310 may be stabilized to lase at a first wavelength, $\lambda_1$, a second laser array 305b may lase at a second wavelength, $\lambda_2$, and a third laser array 305c may lase at a third wavelength, $\lambda_3$. In one example, the VBG 1310 is placed as close as practically possible to the laser stack 310. The transform lens 330 spatially overlaps beams from all the laser arrays 305 onto the diffraction grating 340. In one example, a combination of the focal length $f_2$ of the transform lens 330 and the diffraction grating 340 substantially matches the wavelength spread or dispersion of the VBG 1310. Accordingly, the output beam 360 may be substantially the same as that from a single laser array. FIG. 14B illustrates the optical equivalent in the array dimension of the cavity of FIG. 14A. The array dimension may be used for power scaling Another embodiment of an open-loop wavelength beam combining cavity is illustrated in FIGS. 15A and 15B. FIG. 15A illustrates an optical equivalent of the cavity in the stacking (wavelength beam combining) dimension, and FIG. 15B illustrates an optical equivalent of the cavity in the array (non-wavelength beam combining) dimension. As discussed above, the cylindrical telescope 320 images the beam along the array dimension onto the grating 340, and the transform lens 330 spatially overlaps the beams along the stacking dimension. In the illustrated example, the cavity comprises two additional cylindrical telescopes disposed between the laser stack 310 and the volume Bragg grating 1310. A first cylindrical telescope 1510 is operable along the stacking dimension, and a second cylindrical telescope 1520 is operable on the beams along the array dimension. The first cylindrical telescope 1510 along the stacking dimension functions to reduce the dimension of the beam along the stacking dimension. By reducing the size of the beam, the spectral bandwidth of the system may be reduced by the same amount. As discussed above, narrower spectral bandwidth may be preferred, at least in some applications. The second cylindrical telescope 1520 along the array dimension functions to image the array onto the volume Bragg grating 1310 to reduce losses.

Figure 16A:
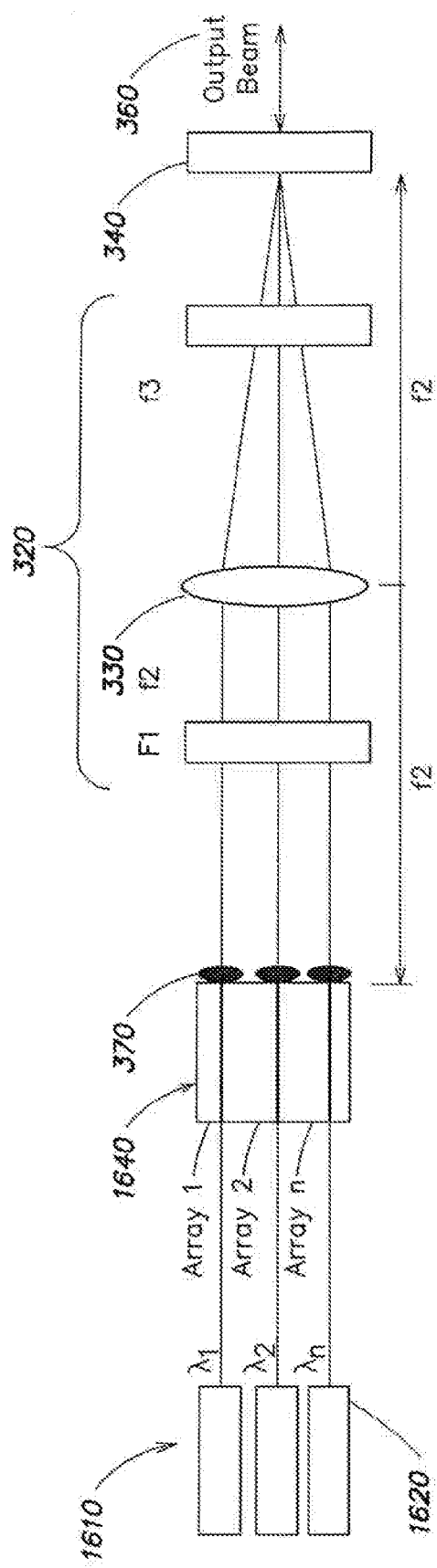
FIG. 16A is an optical equivalent diagram in the wavelength beam combining or stacking dimension of another example of an open-loop one-dimensional wavelength beam combining cavity according to aspects of the invention.
Figure 16B:
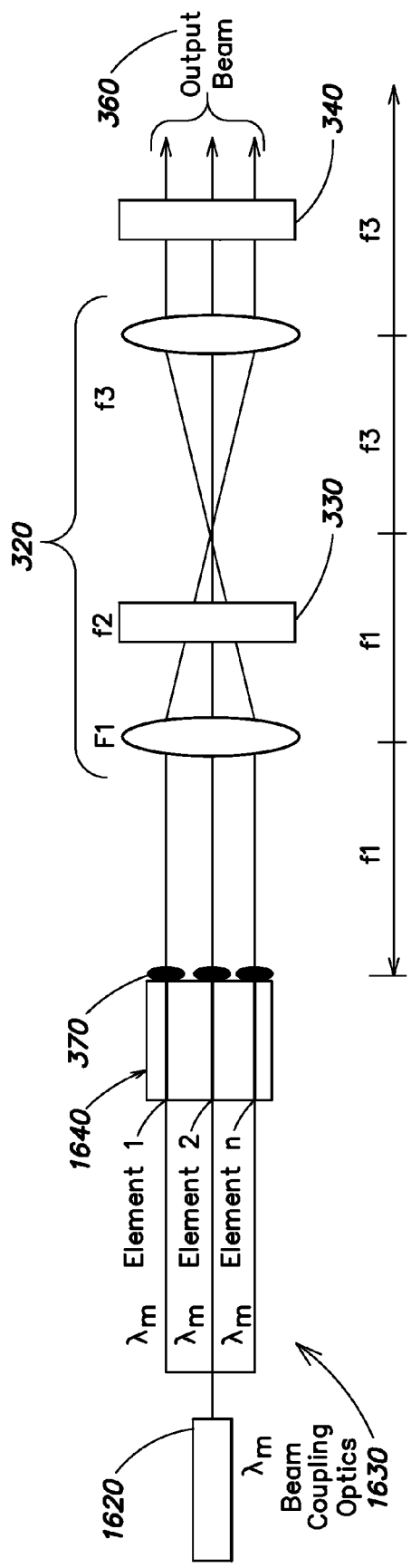
FIG. 16B is an optical equivalent diagram in the non-wavelength beam combining or array dimension of the example cavity of FIG. 16A.

Referring to FIGS. 16A and 16B there is illustrated (in the stacking dimension in FIG. 16A and in the array dimension in FIG. 16B) an example of a fiber laser amplifier according to one embodiment. A master oscillator stack 1610 comprises one or more oscillators 1620, each of which generates an optical beam at a unique wavelength, $\lambda_1 \ldots \lambda_n$ for n oscillators. The beams from the master oscillator stack 1620 are amplified by an amplifier laser stack 1640, wherein the laser elements are configured to function as power amplifiers and the amplified beams are wavelength beam combined as discussed above to generate the multi-wavelength output beam 360. In the illustrated example, the master oscillator stack 1610 comprises three oscillators 1620 and the amplifier stack 1640 comprises three laser arrays 1650; however, it is to be appreciated that the master oscillator stack may comprise any number of oscillators, not limited to three, and the amplifier stack 1640 may comprise any number of laser arrays 1650, as discussed above. As shown in FIG. 16B in the array dimension, beam coupling optics 1630 couple the beams from the oscillators 1620 to the amplifier stack 1640. In one example, the amplifier stack 1640 comprises one or more arrays of fiber laser elements 1660, each of which is configured to function as a power amplifier. The output beam may be coupled into an optical fiber as discussed above with reference to FIG. 10.

According to one embodiment, the master oscillator stack, which may comprise one or more master oscillators 1620, is implemented using an embodiment of the one-dimensional multi-wavelength beam combiners discussed above. The oscillators 1620 may be used in a variety of applications. Similarly, embodiments of the one-dimensional wavelength beam combiners may be used to provide power amplifiers and used in oscillator-amplifier systems, such as communications systems, etc.

Figure 17A:
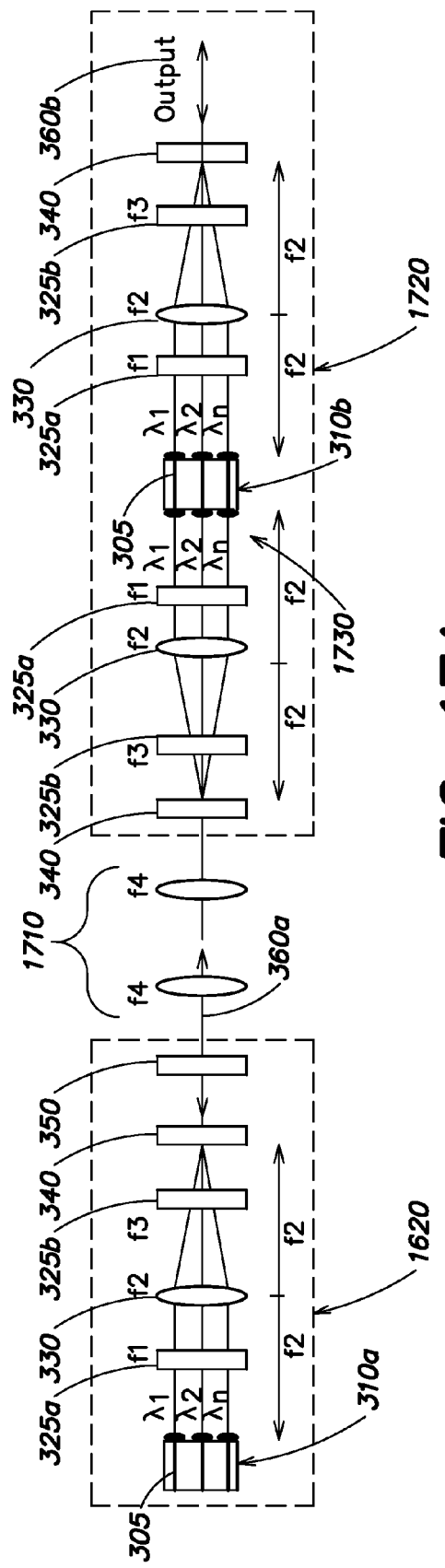
FIG. 17A is an optical equivalent diagram in the wavelength beam combining or stacking dimension of one example of a master oscillator power amplifier incorporating an open-loop wavelength beam combining cavity according to aspects of the invention.
Figure 17B:
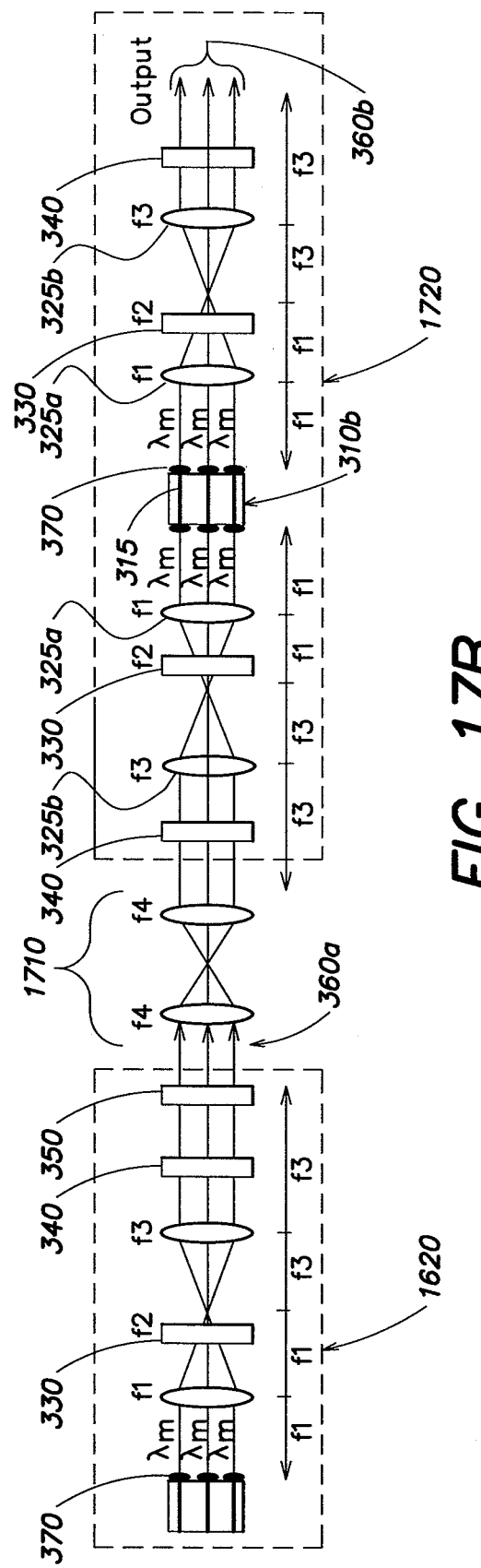
FIG. 17B is an optical equivalent diagram in the non-wavelength beam combining or array dimension of the example amplifier of FIG. 17A.

For example, referring to FIGS. 17A and 17B, an oscillator 1620 may comprise a laser stack 310a comprising one or more laser arrays 305, each laser array comprising one or more laser elements 315, as discussed above. As shown in FIG. 17A, in the stacking dimension, the oscillator 1620 comprises a laser stack 310 that includes n stacked laser arrays 305, each producing an optical beam with a particular wavelength, $\lambda_1 \ldots \lambda_n$, n being an integer greater than or equal to one. In the array dimension, each laser array 305 comprises n laser elements 315 all lasing at the wavelength $\lambda_m$ of the particular array. In the illustrated example, the oscillator 1620 comprises the cylindrical telescope 320, cylindrical transform lens 330, diffraction grating 340, and output coupler 350 that together perform the wavelength beam combining along the stacking dimension as discussed above, to generate a multi-wavelength output beam 360a. It is to be appreciated that the oscillator may be implemented using any of the wavelength beam combining configurations discussed above and may therefore comprise any of the additional optical elements discussed above, as appropriate.

Still referring to FIGS. 17A and 17B, relay optics 1710 may be used to couple the output beam 360a from the oscillator 1620 to a power amplifier 1720. The power amplifier 1720 may include wavelength beam splitting optics that splits the multi-wavelength beam 360a from the oscillator into its component wavelengths $\lambda_1 \ldots \lambda_n$. In one example, the wavelength beam splitting optics includes a diffraction grating 340, a cylindrical telescope comprising lenses 325a and 325b, and a cylindrical transform lens 330 arranged in a substantially minor image configuration of the corresponding wavelength beam combining components discussed above. Collimation optics 1730 may collimate the beams $\lambda_1 \ldots \lambda_n$ and couple them to a laser stack 310b. The laser stack 310b comprises n laser arrays 305, each array comprising n laser elements 315. Micro-lenses 370 collimate the beams from the laser stack 310b, as discussed above. Wavelength beam combining is again performed along the stacking dimension, to produce a high-power, amplified output beam 360b. Further stages of amplification may be performed by using additional relay optics to couple the output beam 360b to another amplifier 1710 through additional coupling optics, and so on.

Figure 19:
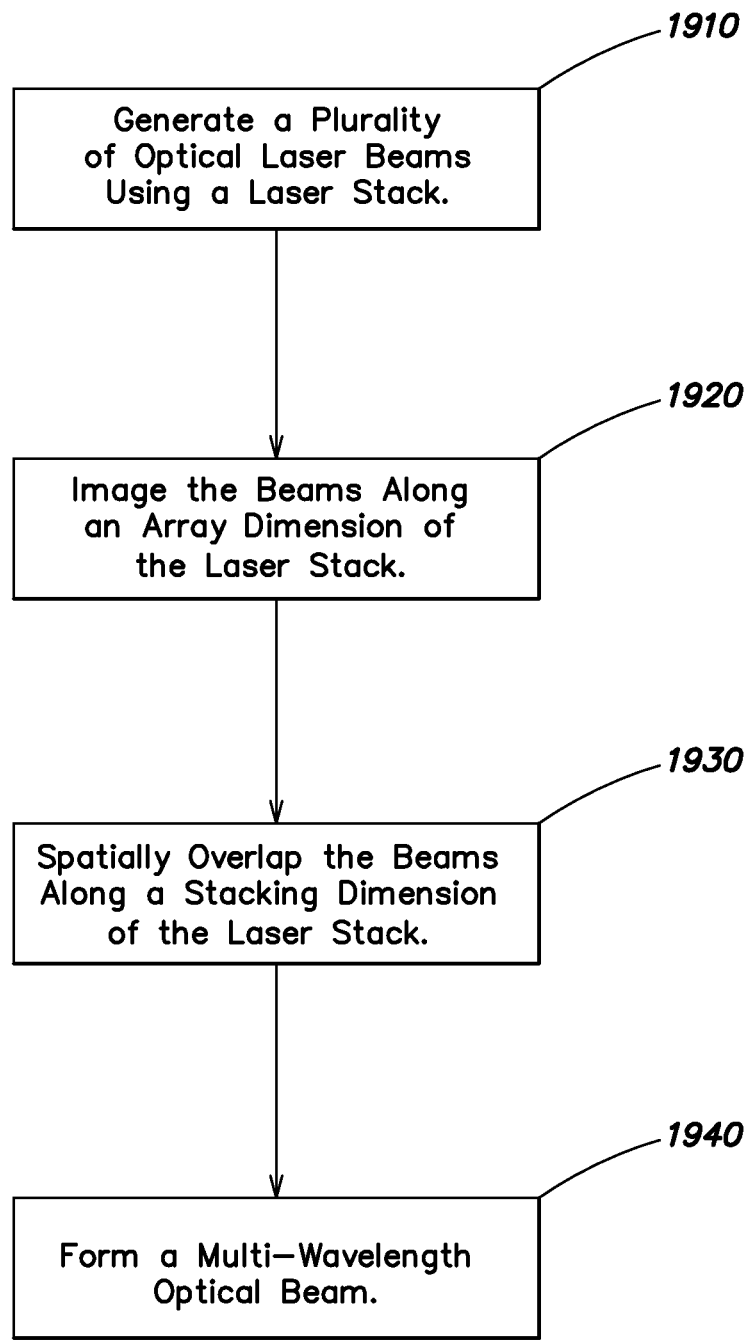
FIG. 19 is a flow diagram illustrating one example of a method of one-dimensional wavelength beam combining cavity according to aspects of the invention.

In accordance with another embodiment, methods of wavelength beam combining using cavities such as those discussed above are disclosed. Referring to FIG. 19, in one example, a method of wavelength beam combining includes generating an optical beam from each laser array making up the laser stack 310 (step 1910). Each optical beam includes light from all of the emitters in the respective laser array. In one example, in which the laser arrays are diode bars, each optical beam includes light from all of the diode emitters, those with smile and those without, in the respective diode bar. As discussed above, each optical beam has a unique wavelength, stabilized by either a volume Bragg grating (for an open loop cavity) or a diffraction grating and output coupler (for a closed loop cavity). In a step 1920, the optical beams are imaged along the array dimension using the cylindrical imaging telescope discussed above, to collimate the beams and reduce optical losses. The method further includes performing wavelength beam combining along the stacking dimension by spatially overlapping the optical beams using the transform lens (step 1930) to form a region of overlap and to produce a multi-wavelength optical beam 360 comprising the plurality of unique wavelengths corresponding to each of the laser arrays in the laser stack 310 (step 1940).

Any of the above-discussed embodiments of wavelength beam combining laser cavities may be incorporated into an associated laser system. Such a laser system may include, for example, the wavelength beam combining cavity, electrical, thermal, mechanical, electro-optical and opto-mechanical laser control equipment, associated software and/or firmware, and an optical power delivery subsystem. Embodiments of the wavelength beam combining laser cavities, and associated laser systems, can be used in applications that benefit from the high power and brightness of the embodied laser source produced using the wavelength beam combining cavity. These applications may include, for example, materials processing, such as welding, drilling, cutting, annealing and brazing; marking; laser pumping; medical applications; and directed energy applications. In many of these applications, the laser source formed by the wavelength beam combining cavity may be incorporated into a machine tool and/or robot to facilitate performance of the laser application.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A multi-wavelength beam combiner comprising:
   a laser stack comprising a plurality of laser arrays arranged along a stacking dimension of the laser stack, each laser array configured to generate optical radiation having a unique wavelength, and each of the plurality of laser arrays comprising at least one optical gain element arranged along an array dimension of the laser stack;
   an optical imaging element configured to image the at least one optical gain element of each laser array along a slow axis of the optical gain elements;
   an optical focusing element arranged to intercept the optical radiation from each of the plurality of laser arrays and combine the optical radiation along the stacking dimension of the laser stack to form a multi-wavelength optical beam; and
   a diffraction element positioned at a region of overlap of the optical radiation to receive and transmit the multi-wavelength optical beam;
   wherein the optical imaging element is configured to image the at least one optical gain element of each laser array onto the diffraction element.

2. The multi-wavelength beam combiner as claimed in claim 1, further comprising a grating positioned between the back facet of the laser stack and the optical imaging element and configured to form an open-loop free-space cavity with the laser stack to generate the plurality of unique wavelengths.

3. The multi-wavelength beam combiner as claimed in claim 1, wherein the optical focusing element includes a transform lens positioned a focal length away from the laser stack.

4. The multi-wavelength beam combiner as claimed in claim 1, wherein the stacking dimension is substantially perpendicular to the array dimension.

5. The multi-wavelength beam combiner as claimed in claim 1, wherein the diffraction element is a diffraction grating.

6. The multi-wavelength beam combiner as claimed in claim 1, further comprising a partially reflecting output coupler arranged to receive the multi-wavelength optical beam from the diffraction element, to reflect a portion of the multi-wavelength optical beam back to the region of overlap, and to transmit the multi-wavelength optical beam comprising optical radiation having the plurality of unique wavelengths;
   wherein the diffraction element, the partially reflecting output coupler and the laser stack together form a free space cavity that produces the plurality of unique wavelengths.

7. The multi-wavelength beam combiner as claimed in claim 1, further comprising an anamorphic beam expander positioned between the laser stack and the optical imaging element.

8. The multi-wavelength beam combiner as claimed in claim 1, wherein the plurality of laser arrays comprises a plurality of semiconductor laser bars; and
wherein the at least one optical gain element comprises a plurality of semiconductor laser emitters.

9. The multi-wavelength beam combiner as claimed in claim 1, wherein the plurality of laser arrays comprises a plurality of fiber laser arrays; and
wherein the at least one optical gain elements comprises a plurality of fiber laser emitters.

10. A multi-wavelength beam combiner comprising:
a laser stack comprising a first laser array configured to generate a first optical beam having a first wavelength, and a second laser array configured to generate a second optical beam having a second wavelength, each of the first and second laser arrays comprising at least one optical gain element arranged along an array dimension of the laser stack and configured to produce optical radiation to generate the first and second optical beams;
an optical imaging element arranged to intercept the optical radiation and to image the at least one optical gain element of each of the first and second laser arrays along the array dimension;
an optical focusing element arranged to intercept the first and second optical beams and to spatially overlap in a stacking dimension of the laser stack the first and second optical beams to form a multi-wavelength optical beam;
a diffraction element positioned at a region of overlap of the first and second optical beams; and
a partially reflecting output coupler arranged to receive the multi-wavelength optical beam from the diffraction element, to reflect a portion of the multi-wavelength optical beam back to the region of overlap, and to transmit the multi-wavelength optical beam comprising optical radiation having the first and second wavelengths;
wherein the diffraction element, the partially reflecting output coupler and the laser stack together form a free space cavity that produces the first and second wavelengths; and
wherein the stacking dimension is substantially perpendicular to the array dimension.

11. The multi-wavelength beam combiner as claimed in claim 10, wherein the first and second laser arrays are semiconductor laser bars, each semiconductor laser bar comprising a plurality of semiconductor laser emitters.

12. The multi-wavelength beam combiner as claimed in claim 10, wherein the first and second laser arrays are fiber laser arrays; and
wherein the at least one optical gain element comprises a plurality of fiber laser emitters.

13. A method of wavelength beam combining comprising:
generating with a plurality of laser arrays a plurality of optical beams each having a unique wavelength;
imaging the plurality of optical beams along a first dimension; and
spatially overlapping the plurality of optical beams in a second dimension at a region of overlap to produce a multi-wavelength optical beam comprising the plurality of unique wavelengths.

14. The method as claimed in claim 13, wherein spatially overlapping the plurality of optical beams includes propagating the plurality of optical beams to a diffractive element positioned at the region of overlap.

15. The method as claimed in claim 13, further comprising:
propagating the multi-wavelength optical beam to a partially reflecting element positioned to receive radiation from the diffractive element, the partially reflecting element and the plurality of laser arrays together forming a free space laser cavity that produces the plurality of unique wavelengths; and
transmitting the multi-wavelength beam comprising radiation having the plurality of unique wavelengths through the partially reflecting element.

16. The method as claimed in claim 13, further comprising stabilizing the plurality of unique wavelengths with a grating.

17. A master oscillator power amplifier comprising
an oscillator laser stack including a plurality of oscillators each of which is configured to generate an optical beam having a unique wavelength;
an amplifier laser stack optically coupled to the oscillator laser stack and configured to receive and amplify the optical beams to provide a plurality of amplified beams;
an optical imaging element configured to image the plurality of amplified beams along an array dimension;
an optical focusing element configured to combine the plurality of amplified beams along a stacking dimension, orthogonal to the array dimension, to form a multi-wavelength optical beam; and
a diffraction element positioned at a region of overlap of the plurality of amplified beams and configured to receive and transmit the multi-wavelength optical beam;
wherein the optical imaging element is configured to image each of the plurality of amplified beams onto the diffraction element.

18. The master oscillator power amplifier as claimed in claim 17, further comprising:
beam coupling optics positioned between the oscillator laser stack and the amplifier laser stack and configured to couple the optical beams from the oscillator laser stack to the amplifier laser stack.

19. The master oscillator power amplifier as claimed in claim 17, wherein the amplifier laser stack includes a plurality of laser arrays arranged along the stacking dimension, each laser array including at least one laser emitter arranged along the array dimension and configured to function as a power amplifier.

20. A master oscillator power amplifier comprising:
an oscillator laser stack including a plurality of laser arrays arranged along a stacking dimension of the oscillator laser stack, each laser array including at least one laser emitter arranged along an array dimension which is orthogonal to the stacking dimension, each laser array configured to produce an optical beam having a unique wavelength such that the oscillator laser stack produces a plurality of optical beams;
a first optical imaging element configured to image the at least one laser emitter along a slow axis of the laser emitters;
a first optical focusing element arranged to intercept and combine the plurality of optical beams along the stacking dimension to form a multi-wavelength optical beam; and
a first diffraction element positioned at a region of overlap of the plurality of optical beams and configured to receive and transmit the multi-wavelength optical beam; and
a power amplifier configured to receive and amplify the multi-wavelength optical beam to produce a multi-wavelength amplified output beam;
wherein the first optical imaging element is configured to image the at least one laser emitter onto the first diffraction element.

21. The master oscillator power amplifier as claimed in claim 20, further comprising relay optics configured to couple the multi-wavelength optical beam from the first diffraction element to the power amplifier.

22. The master oscillator power amplifier as claimed in claim 20, wherein the power amplifier includes:
- beam splitting optics configured to split the multi-wavelength optical beam into the plurality of optical beams having unique wavelengths;
- an amplifier laser stack configured to amplify the plurality of optical beams to provide a plurality of amplified optical beams having the unique wavelengths;
- collimation optics configured to collimate the plurality of optical beams and couple the plurality of optical beams to the amplifier laser stack; and
- beam combining optics configured to receive the plurality of amplified optical beams from the laser stack and to combine the plurality of amplified optical beams into the multi-wavelength amplified output beam.

23. The master oscillator power amplifier as claimed in claim 22, wherein the amplifier laser stack includes:
- a plurality of amplifier laser arrays arranged along the stacking dimension, each amplifier laser array including at least one amplifier laser emitter arranged along the array dimension and configured to function as a power amplifier.

24. The master oscillator power amplifier as claimed in claim 23 further comprising:
- a plurality of arrays of microlenses coupled to the plurality of amplifier laser arrays and configured to collimate the plurality of amplified optical beams.

25. The master oscillator power amplifier as claimed in claim 23, wherein the beam splitting optics includes:
- a second diffraction element;
- a second optical focusing element configured to split the multi-wavelength optical beam into the plurality of optical beams having unique wavelengths; and
- a second imaging optical element configured to image the multi-wavelength optical beam from the second diffraction element onto the second optical focusing element.

26. The master oscillator power amplifier as claimed in claim 23, wherein the beam combining optics includes:
- a second optical imaging element configured to image of the plurality of amplifier laser emitters along a slow axis of the amplifier laser emitters;
- a second optical focusing element arranged to intercept and combine the plurality of amplified optical beams along the stacking dimension to form the multi-wavelength amplified output beam; and
- a second diffraction element positioned at a region of overlap of the plurality of amplified optical beams and configured to receive and transmit the multi-wavelength amplified output beam;
- wherein the second optical imaging element is configured to image the at least one amplifier laser emitter onto the second diffraction element.

* * * * *

UNITED STATES PATENT AND TRADEMARK OFFICE
CERTIFICATE OF CORRECTION

PATENT NO. : 8,531,772 B2
APPLICATION NO. : 13/231407
DATED : September 10, 2013
INVENTOR(S) : Bien Chann et al.

Page 1 of 1

It is certified that error appears in the above-identified patent and that said Letters Patent is hereby corrected as shown below:

In the Specification:

In column 8, line 35, "minors" should be --mirrors--.

In column 8, line 40, "minors" should be --mirrors--.

In column 21, line 17, "minor" should be --mirror--.

Signed and Sealed this
Fifth Day of November, 2013

Teresa Stanek Rea
*Deputy Director of the United States Patent and Trademark Office*